(12) United States Patent
Albiez et al.

(10) Patent No.: US 9,741,528 B2
(45) Date of Patent: Aug. 22, 2017

(54) CHARGED PARTICLE OPTICAL APPARATUS HAVING A SELECTIVELY POSITIONABLE DIFFERENTIAL PRESSURE MODULE

(71) Applicant: Carl Zeiss Microscopy GmbH, Jena (DE)

(72) Inventors: Michael Albiez, Aalen (DE); Stefan Meyer, Aalen (DE); Daniel Kirsten, Lübeck (DE); Stewart Bean, Cambridgeshire (GB); Erik Essers, Aalen (DE)

(73) Assignee: CARL ZEISS MICROSCOPY GMBH, Jena (DE)

( * ) Notice: Subject to any disclaimer, the term of this patent is extended or adjusted under 35 U.S.C. 154(b) by 0 days.

(21) Appl. No.: 14/724,681

(22) Filed: May 28, 2015

(65) Prior Publication Data
US 2015/0348742 A1 Dec. 3, 2015

(30) Foreign Application Priority Data

May 28, 2014 (EP) .................................... 14001865

(51) Int. Cl.
- *H01J 37/18* (2006.01)
- *H01J 37/244* (2006.01)
- *H01J 37/28* (2006.01)

(52) U.S. Cl.
CPC ............ *H01J 37/18* (2013.01); *H01J 37/244* (2013.01); *H01J 37/28* (2013.01);
(Continued)

(58) Field of Classification Search
CPC ............................................... H01J 2237/188
See application file for complete search history.

(56) References Cited

U.S. PATENT DOCUMENTS

| 4,720,633 A | 1/1988 | Nelson |
| 4,823,006 A | 4/1989 | Danilatos et al. |

(Continued)

FOREIGN PATENT DOCUMENTS

| JP | 2008-010177 A | 1/2008 |
| JP | 2008010177 A * | 1/2008 |

(Continued)

OTHER PUBLICATIONS http://www.merriam-webster.com/dictionary/track.*
Extended European Search Report dated Nov. 13, 2014 from parallel European patent application No. 14 001 865.6.

*Primary Examiner* — Jack Berman
(74) *Attorney, Agent, or Firm* — Alston & Bird LLP

(57) ABSTRACT

Disclosed is a charged particle optical apparatus, which includes a particle optical arrangement, configured to define a particle beam path for inspecting an object. The object is accommodated in a pressure-controlled interior of a specimen chamber during the inspection of the object. The charged particle optical apparatus further includes a differential pressure module having a differential pressure aperture. A positioning arm is arranged in the specimen chamber for selectively position the differential pressure module within the pressure-controlled interior of the specimen chamber into an operating position in which the particle beam path passes through the differential pressure aperture. The selective positioning includes an advancing movement of the differential pressure module toward the primary particle beam path. The advancing movement is transmitted to the differential pressure module by a track-guided movement of the positioning arm.

38 Claims, 16 Drawing Sheets

(52) U.S. Cl.
CPC ..... *H01J 2237/10* (2013.01); *H01J 2237/188* (2013.01); *H01J 2237/2605* (2013.01)

(56) References Cited

U.S. PATENT DOCUMENTS

| | | | |
|---|---|---|---|
| 5,250,808 A | 10/1993 | Danilatos et al. | |
| 6,590,210 B1* | 7/2003 | Essers | H01J 37/244 |
| | | | 250/397 |
| 8,148,684 B2 | 4/2012 | Yoshikawa | |
| 2004/0173747 A1 | 9/2004 | Dean et al. | |
| 2011/0006209 A1 | 1/2011 | Yoshikawa | |

FOREIGN PATENT DOCUMENTS

| | | |
|---|---|---|
| JP | 201 1-01 8506 | 1/2011 |
| JP | 5351634 B2 | 11/2013 |
| WO | WO 99/46797 | 9/1999 |
| WO | WO 02/086942 A1 | 10/2002 |

* cited by examiner

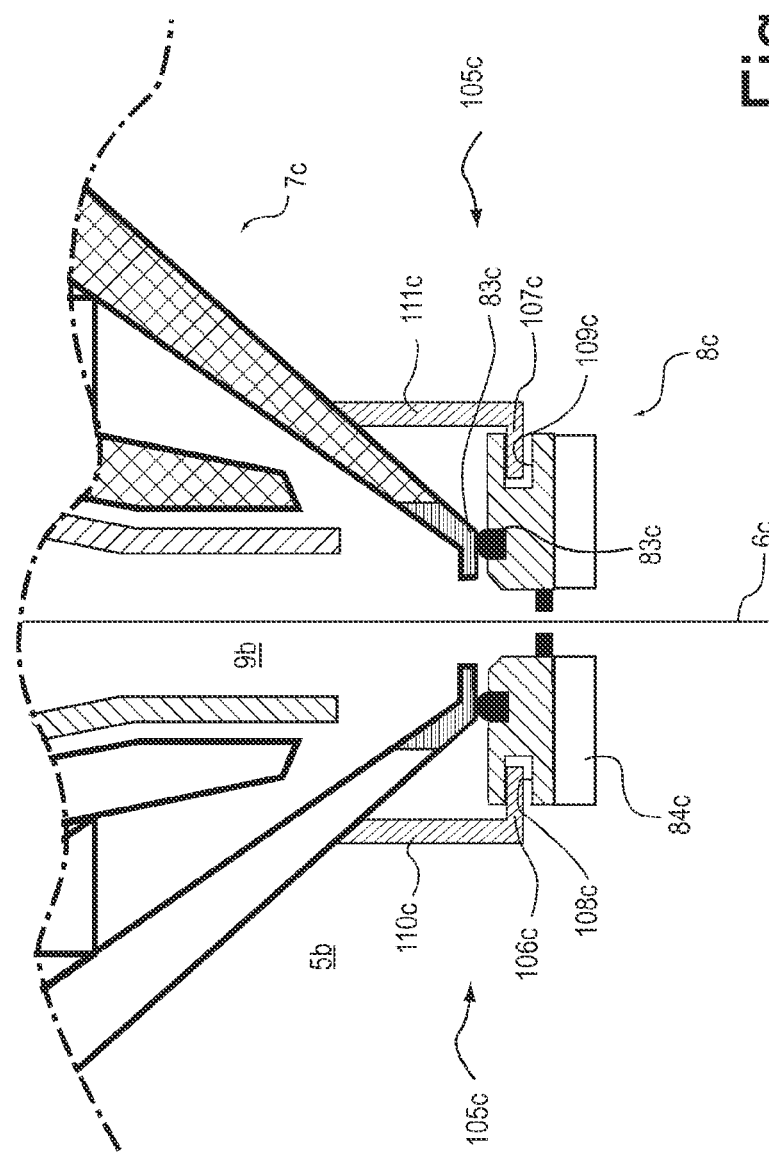

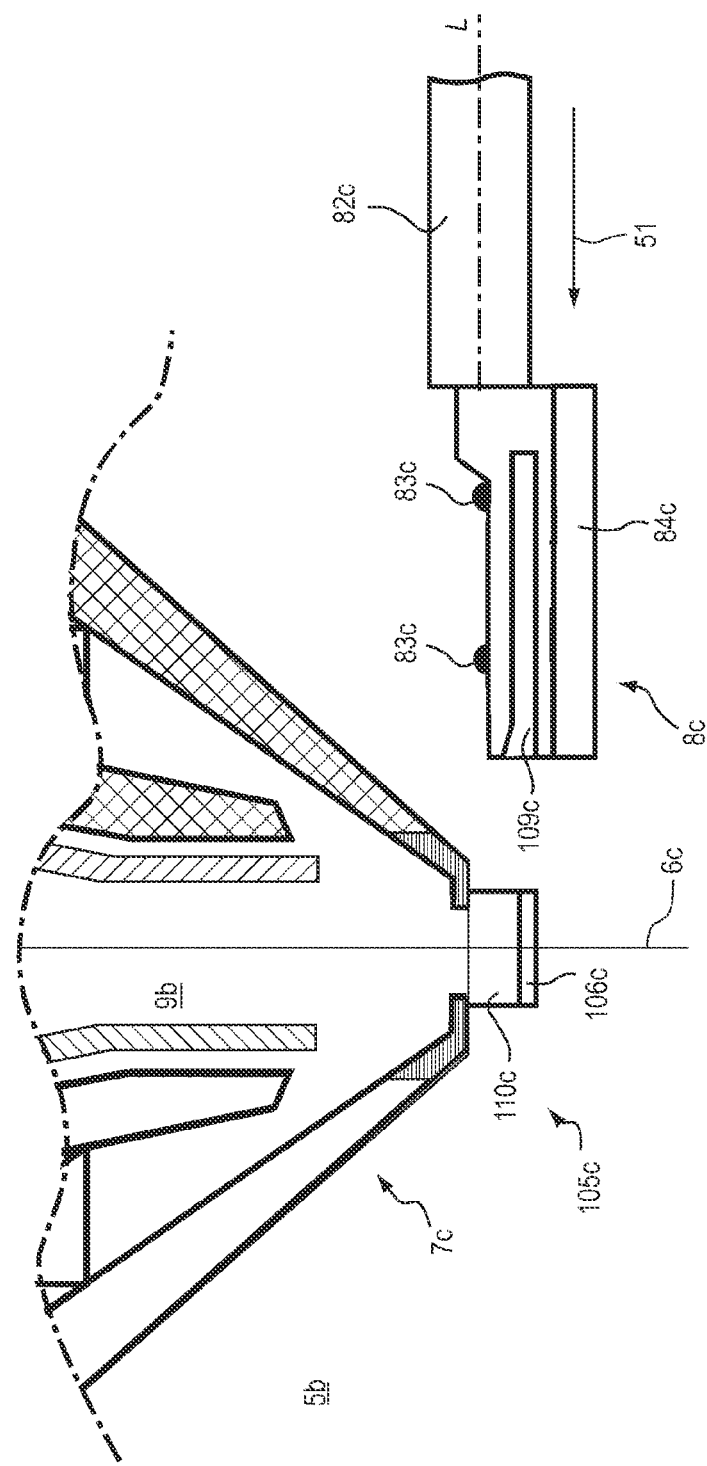

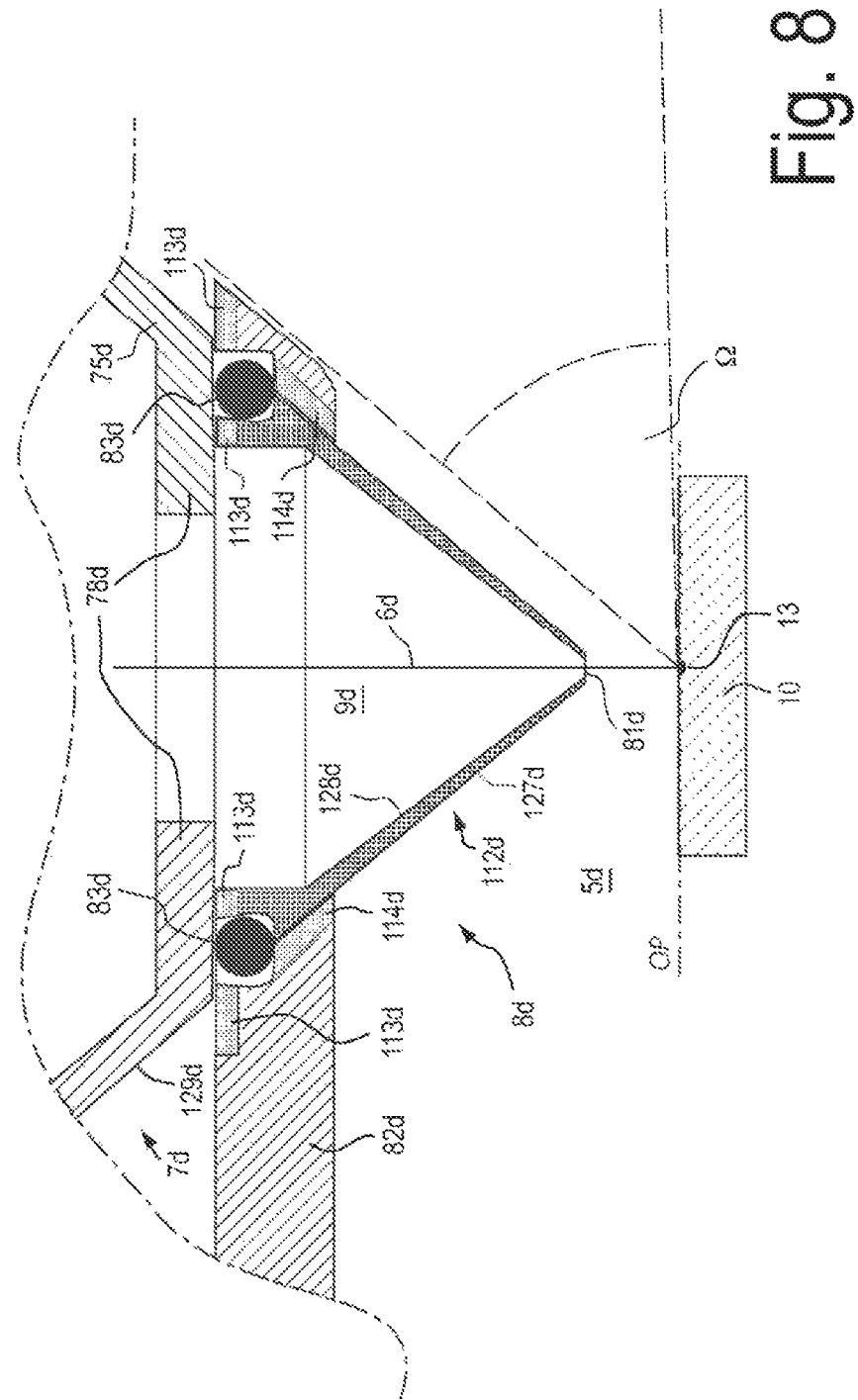

CHARGED PARTICLE OPTICAL APPARATUS HAVING A SELECTIVELY POSITIONABLE DIFFERENTIAL PRESSURE MODULE

CROSS-REFERENCE TO RELATED APPLICATIONS

This application claims the benefit of European Patent Application No. 14 001 865.6 filed May 28, 2014, the entire contents of which is hereby incorporated herein by this reference.

TECHNICAL FIELD OF THE INVENTION

The present invention relates to a charged particle apparatus. More specifically, the invention is concerned with a scanning electron microscope capable of operating efficiently at a high-vacuum pressure level in the specimen chamber as well as at substantially higher pressure levels than high vacuum.

BACKGROUND

In conventional scanning electron microscopes (SEM), the specimen chamber is typically maintained at a vacuum pressure of 0.01 Pa or lower. This allows maintaining a sufficiently low pressure level in the electron gun and also to use so-called "in-lens" or "through-the-lens" detector systems, which are typically disposed inside the particle optical column. These low pressure levels also prevent degradation of the image quality, which may occur due to collisions of primary beam electrons with residue gas particles.

However, the requirement of maintaining the specimen chamber at a high vacuum makes it difficult to inspect wet or non-conductive specimens, such as biological materials, plastics, ceramics, minerals and fibers. Wet specimen deteriorate the vacuum pressure level by outgassing. For non-conductive specimen, the low vacuum pressure level prevents dissipation of surface charges that accumulate on the surface.

To enable inspection of wet or non-conductive specimens, preparation techniques, such as drying, freezing or vacuum coating have been developed. These techniques, however, are often not desirable, since they tend to alter or mask the sample surface.

Attempts to overcome these constraints have led to the development of special kinds of scanning electron microscopes, such as variable-pressure scanning electron microscopes (VPSEMs) and environmental scanning electron microscopes (ESEMs). These types of scanning electron microscopes can be operated at elevated gas or vapor pressure levels in the specimen chamber, which can be up to 2500 Pa in the case of ESEMs. Operation at these elevated pressure levels is made possible by one or more differential pressure apertures, which are provided to limit the amount of gas in the electron optical column.

However, it has been shown that these technologies are not fully compatible with through-the-lens detector systems, since the additional differential pressure apertures often reduce the amount of backscattered electrons and secondary electrons, which pass through the objective lens, and hence, the detected electron intensity. Further, the additional differential pressure apertures typically limit the attainable field of view.

Accordingly, there is a need to provide a particle optical system, which allows efficient inspection of a wide range of objects.

SUMMARY

Embodiments provide a charged particle optical apparatus. The charged particle optical apparatus includes a particle optical arrangement configured to define a primary particle beam path for inspecting an object. The charged particle optical apparatus further includes a specimen chamber configured to accommodate an object in a pressure-controlled interior of the specimen chamber during the inspection of the object. The charged particle optical apparatus may further include a differential pressure module having a differential pressure aperture. The charged particle optical apparatus may include a positioning arm being at least partially arranged in the specimen chamber and configured to selectively position the differential pressure module within the pressure-controlled interior of the specimen chamber into an operating position. In the operating position, the primary particle beam path may pass through the differential pressure aperture. The selective positioning may include an advancing movement of the differential pressure module directed in a direction toward a section of the primary particle beam path, which is within the specimen chamber. The advancing movement may be transmitted to the differential pressure module by a track-guided movement of the positioning arm.

Accordingly, a charged particle optical apparatus is provided, which allows selectively disposing a differential pressure aperture in the primary particle beam path in an efficient manner. This enables fast switching between two operation modes, which may be provided for inspecting objects at different pressure level ranges in the specimen chamber. By way of example, the first operation mode is configured for pressure levels of 0.01 Pa or lower in the specimen chamber and the second operation mode is configured for pressure levels higher than 0.01 Pa in the specimen chamber. It is a further advantage that the track-guided movement of the positioning arm leaves plenty of space in the interior of the specimen chamber for further components of the particle optical apparatus, such as detectors and gas supply systems.

The charged particle optical apparatus may be a particle microscope, in particular a scanning particle microscope. The scanning particle microscope may be a scanning electron microscope and/or a focused ion beam microscope. The focused ion beam microscope may comprise a gas field ion source, a plasma ion source and/or a liquid metal ion source. By way of example, the focused ion beam microscope is a noble gas ion microscope, in particular a helium ion microscope.

The particle optical arrangement may be configured to focus the primary particle beam on a surface of the object. The particle optical arrangement may be configured to scan the primary particle beam across the surface of the object. The particle optical arrangement may include an objective lens, a condenser lens, a beam booster, a particle gun and/or a deflector system. The deflector system may be configured to deflect the primary particle beam. The objective lens may be configured as an electrostatic lens, as a magnetic lens or as a combined magnetic-electrostatic objective lens.

The specimen chamber may be configured as a vacuum chamber. The specimen chamber may be configured to hermetically separate the interior of the specimen chamber from the surrounding atmosphere. The specimen chamber may include a vacuum port for evacuating the specimen chamber. The vacuum port may be in fluid communication with a vacuum source. The interior of the specimen chamber may be configured as a single vacuum zone. The charged particle optical apparatus may include a plurality of vacuum zones. The vacuum zones may be generated by differential pumping. Each of the vacuum zones may have a substantially uniform vacuum pressure level. Each of the vacuum zones may be undivided by differential pressure apertures.

The differential pressure aperture of the differential pressure module may have a width, which is in a range of between 50 micrometers and 2000 micrometers or which is in a range of between 100 micrometers and 1000 micrometers. The width may be measured in a direction perpendicular to the primary particle beam path. The differential pressure aperture may have a length, which is in a range of between 20 micrometers and 10 millimeters, or in a range of between 50 micrometers and 10 millimeters, or in a range of between 100 micrometers and 10 millimeters. The length may be measured in a direction parallel to the primary particle beam path. The differential pressure aperture may be formed in a foil and/or plate.

The differential pressure module may be configured such that in the operating position, the differential pressure aperture separates two vacuum zones of the charged particle optical apparatus. Through the differential pressure aperture, the primary particle beam path may enter into the interior of the specimen chamber. With the differential pressure module being disposed in the operating position, a differential pressure drop may be maintainable across the differential pressure aperture. A pressure ratio P2/P1 across the differential pressure aperture may be below 0.5, below 0.1, or below 0.01, or below 0.001. P1 may be defined as the pressure level of the vacuum zone of the interior of the specimen chamber. P2 may be defined as the pressure level of the vacuum zone, which is separated from the interior of the specimen chamber by the differential pressure aperture.

The charged particle optical apparatus may be switchable to a first and a second operation mode. In the first operation mode, the differential pressure module may be disposed in a non-operating position. In the second operation mode, the differential pressure module may be disposed in the operating position. The charged particle optical apparatus may include a controller, which is configured to switch the particle optical apparatus to the first and/or to the second operation mode.

Prior systems have coupled objects to an electron beam source in a specimen chamber, for example the system as described in U.S. Pat. No. 8,148,684 (Yoshikawa). In Yoshikawa, an aperture member is detachably coupled to an electron beam source by a certain mechanism for moving the object. However, the instant invention offers a novel and unique system for moving the differential pressure module to different positions in relation to the first and second operation mode. The presented novel and unique system for moving the differential pressure module allows for rapid positioning of the differential pressure module into the different positions with higher accuracy than prior systems.

The positioning of the differential pressure module within the specimen chamber is performed in the vacuum-controlled environment. In other words, the positioning may be performed while the interior of the specimen chamber is evacuated, i.e. the specimen chamber may not need to be vented during the positioning process.

The positioning arm may have a longitudinal shape. During at least a portion of the positioning, a first portion of the positioning arm may be disposed in a surrounding atmosphere of the charged particle optical apparatus and/or a second portion of the positioning arm may be disposed in the specimen chamber. During at least a portion of the positioning, the positioning arm may extend through a vacuum enclosure of the particle optical apparatus. In other words, the positioning arm may extend from outside the vacuum enclosure to inside the vacuum enclosure. The vacuum enclosure may separate the vacuum from the surrounding atmosphere. The track-guided movement of the positioning arm may include inserting at least a portion of the positioning arm into the specimen chamber.

The positioning arm may be a rigid body. The positioning arm may be an elongate body extending along a longitudinal axis of the positioning arm. A portion or all of the positioning arm may substantially be in the form of a bar. By way of example, the bar is a square and/or a round bar. The track-guided movement may advance and/or approach the positioning arm toward a segment of the primary beam path, which extends inside the specimen chamber. In other words, the track-guided movement may be directed toward the segment of the primary beam path. The longitudinal axis of the positioning arm may be oriented transverse, substantially perpendicular or perpendicular to a direction of the primary beam path, wherein the direction of the primary beam path is measured at a location within the specimen chamber. Additionally or alternatively, the longitudinal axis of the positioning arm may be oriented at an angle relative to a plane, which is perpendicular to the direction of the primary beam path, wherein the angle is smaller than 80 degrees, or smaller than 70 degrees, or smaller than 60 degrees, or smaller than 50 degrees, or smaller than 40 degrees, or smaller than 30 degrees, or smaller than 20 degrees, or smaller than 10 degrees, or smaller than 5 degrees.

The track-guided movement may be a longitudinal movement or a substantially longitudinal movement of the positioning arm. A direction of the track-guided movement may be oriented parallel or substantially parallel to the longitudinal axis of the positioning arm. An angle between the longitudinal axis of the positioning arm and the direction of the track-guided movement of the positioning arm may be less than 80 degrees, or less than 70 degrees, or less than 60 degrees, or less than 50 degrees, or less than 40 degrees, or less than 30 degrees, or less than 20 degrees, or less than 10 degrees, or less than 5 degrees, or less than 2 degrees. The angle may vary with the positioning of the differential pressure module. The track-guided movement, may be configured so that an orientation of the positioning arm relative to the longitudinal axis of the positioning arm is kept constant or substantially constant. In other words, the track-guided movement may be configured so that the positioning arm does not or substantially does not rotate about its longitudinal axis.

The charged particle optical apparatus may include a guide configured to guide the advancing movement of the differential pressure module and/or the track-guided movement of the positioning arm. The guide may define a guiding path. The guiding path may extend along a guide track of the guide. The guide track may be formed by a rail of the guide. Thereby, the guiding path may extend along a rail of the guide.

At least a portion of the guide, at least a portion of the rail, at least a portion of the guide track and/or at least a portion of the guiding path may be disposed outside of the specimen chamber and/or in a surrounding atmosphere of the charged particle optical apparatus. Additionally or alternatively, at least a portion of the guide, at least a portion of the rail, at least a portion of the guide track and/or at least a portion of the guiding path may be disposed inside the specimen chamber. At least a portion of the rail, at least a portion of the guide track and/or at least a portion of the guiding path may be oriented transverse, substantially perpendicular to, or perpendicular to a direction of the primary beam path, wherein the direction is measured at a location within the specimen chamber. The guide track may be formed by the rail and/or by the positioning arm. Additionally or alternatively, at least a portion of the rail may be oriented at an angle relative to a plane, which is perpendicular to the direction of the primary beam path, wherein the angle is smaller than 80 degrees, or smaller than 70 degrees, or smaller than 60 degrees, or smaller than 50 degrees, or smaller than 40 degrees, or smaller than 30 degrees, or smaller than 20 degrees, or smaller than 10 degrees, or smaller than 5 degrees. Additionally or alternatively, at least a portion of the guide track may be oriented at an angle relative to a plane, which is perpendicular to the direction of the primary beam path, wherein the angle, is smaller than 80 degrees, or smaller than 70 degrees, or smaller than 60 degrees, or smaller than 50 degrees, or smaller than 40 degrees, or smaller than 30 degrees, or smaller than 20 degrees, or smaller than 10 degrees, or smaller than 5 degrees. Additionally or alternatively, at least a portion of the guiding path may be oriented at an angle relative to a plane, which is perpendicular to the direction of the primary beam path, wherein the angle, is smaller than 80 degrees, or smaller than 70 degrees, or smaller than 60 degrees, or smaller than 50 degrees, or smaller than 40 degrees, or smaller than 30 degrees, or smaller than 20 degrees, or smaller than 10 degrees, or smaller than 5 degrees. The direction of the primary beam path may be measured at a location within the specimen chamber.

The guiding path may have two ends. In other words, the guide may be configured so that the guiding path does not form a loop. The guiding path may be longitudinal, substantially linear, linear and/or curved.

The guide may include two mating guide members. The first guide member may be configured as a rail, may form a guide track and/or may define a guiding path. The second guide member may be configured as a carriage and/or may be configured to be movable along the guiding path and/or the guide track. The carriage may be a slide carriage and/or a roller carriage. The positioning arm may be configured as a guide member, such as a rail of the guide. Thereby, the positioning arm may form a guide track. The guiding path may be defined as a path along which one of the mating guide member travels.

The positioning arm may be rigidly connected to a guide member of the two mating guide members. The guide member to which the positioning arm is rigidly connected may travel along a rail and/or a guiding path of the guide, may be a carriage and/or may be a rail.

The differential pressure module may be abuttingly, rigidly and/or movably attached to the positioning arm. The positioning arm may be configured to position the differential pressure module between the non-operating position and the operating position. In the non-operating position, the differential pressure module may be disposed spaced apart from a segment of the primary particle beam path, which extends inside the specimen chamber.

The advancing movement may approach the differential pressure module toward a segment of the primary particle beam path, which extends inside the specimen chamber. In other words, the advancing movement may be directed toward the segment of the primary beam path. During the positioning and/or during the advancing movement, the differential pressure module may be brought into abutment with an abutment portion. In the operating position, the differential pressure module may be abutted against the abutment portion. The abutment portion may be a portion of the objective lens and/or may be rigidly connected to the objective lens, such as a housing, which at least partially accommodates the objective lens. Additionally or alternatively, during the advancing movement, the differential pressure module may be brought into intersection with the primary particle beam path within the specimen chamber. A final position of the advancement movement may be the operating position of the differential pressure module. Additionally or alternatively, in the final position of the advancing movement, the differential pressure module may touch the abutment portion. The advancing movement may bring the differential pressure module into sealing engagement with the abutment portion.

According to an embodiment, a direction of the advancing movement of the differential pressure module and/or a direction of the track-guided movement of the positioning arm is oriented transverse to, substantially perpendicular to, or perpendicular to a direction of the particle beam path measured at a location within the specimen chamber. Additionally or alternatively, the direction of the advancing movement of the differential pressure module may be oriented at an angle relative to a plane, which is perpendicular to the direction of the primary beam path, wherein the angle is smaller than 80 degrees, or smaller than 70 degrees, or smaller than 60 degrees, or smaller than 50 degrees, or smaller than 40 degrees, or smaller than 30 degrees, or smaller than 20 degrees, or smaller than 10 degrees, or smaller than 5 degrees. Additionally or alternatively, the direction of the track-guided movement of the positioning arm may be oriented at an angle relative to a plane, which is perpendicular to the direction of the primary beam path, wherein the angle is smaller than 80 degrees, or smaller than 70 degrees, or smaller than 60 degrees, or smaller than 50 degrees, or smaller than 40 degrees, or smaller than 30 degrees, or smaller than 20 degrees, or smaller than 10 degrees, or smaller than 5 degrees.

According to an embodiment, the advancing movement of the differential pressure module and/or the track-guided movement of the positioning arm is a substantially translational, a translational, or a combined translational and rotational movement.

According to an embodiment, the positioning of the differential pressure module includes performing, after completion of the advancing movement, a pressing movement of the differential pressure module for pressing the differential pressure module against the abutment portion. The pressing movement may be directed toward the abutment portion. A pressing force for pressing the differential pressure module against the abutment portion may be transmitted by the positioning arm. The pressing movement may compress a resilient sealing element of the differential pressure module. The pressing movement may bring the differential pressure module into sealing engagement with the abutment portion.

The pressing movement of the differential pressure module may be performed substantially in a direction parallel to a direction of the primary particle beam path measured at a location within the specimen chamber. The pressing movement may be transmitted to the differential pressure module by a rotational movement, a pivoting movement, a substantially translational movement and/or a translational movement of the positioning arm. The final position of the pressing movement may be the operating position. The starting position of the pressing movement may be the final position of the advancing movement. In the starting position of the pressing movement, the differential pressure module may touch the abutment portion.

According to an embodiment, the differential pressure module comprises a module-mounted detector for detecting particles and/or radiation.

The module-mounted detector may be rigidly and/or abuttingly attached to the remaining portion of the differential pressure module. The module-mounted detector may be advanced toward the primary particle beam path by the advancing movement. In the operating position of the differential pressure module, one or more particle and/or radiation receiving surfaces of the module-mounted particle detector may be disposed in the interior of the specimen chamber. In the operating position of the differential pressure module, one or more of the particle and/or radiation receiving surfaces of the module-mounteds particle detector may be arranged circumferentially around the primary particle beam path.

The module-mounted detector may be configured to detect emitted particles, which are emitted from the object. The emitted particles may be primary particles and/or object particles. The module-mounted detector may be configured to selectively detect primary particles and/or object particles. Primary particles may be defined as particles of the primary particle beam, which are backscattered by the object, such as backscattered electrons. Object particles may be defined as particles of the object, which are released from the object when impacted by the primary particle beam. By way of example, the object particles are secondary ions and/or secondary electrons. The module-mounted detector may include one or a combination of a semiconductor detector, a scintillator detector, a gaseous detector, a 4Q detector and a metal electrode detector for measuring the particle current impinging on the metal electrode. Additionally or alternatively, the module-mounted detector may be configured to detect radiation, such as cathodoluminescence radiation emitted from the interaction region.

According to an embodiment, at least a portion of the differential pressure aperture is formed by a component of the module-mounted detector, which contributes to a generation of a detector signal in response to receiving particles and/or radiation. The particles and/or radiation may be received on a particle and/or radiation receiving surface of the module-mounted detector. By way of example, the component is a portion of a semiconductor substrate of a semiconductor particle detector or a portion of a scintillator of a scintillator detector.

According to a further embodiment, during the positioning of the differential pressure module and/or during the advancing movement of the differential pressure module, at least a portion of the positioning arm passes through at least a portion of an opening extending through a wall portion of the specimen chamber. Additionally or alternatively, during the positioning of the differential pressure module and/or during the advancing movement, a portion of a driving member of the particle optical apparatus, which is drivingly coupled to the positioning arm, may pass through at least the portion of the opening.

The driving member may be rigidly and/or movably connected to the positioning arm. The advancing movement of the differential pressure module may be transmitted by a movement of the driving member. The movement of the driving member may be track-guided. During at least a portion of the positioning of the differential pressure module, the positioning arm and/or the driving member may extend through the vacuum enclosure. A surface normal of the wall portion may be oriented parallel or substantially parallel to a longitudinal axis of the driving member and/or a longitudinal axis of the positioning arm.

According to an embodiment, a degree of freedom of the positioning arm for performing at least a portion of the positioning of the differential pressure module or at least a portion of the pressing movement is provided by a guide clearance of the guide for guiding the track-guided movement of the positioning arm. The guide clearance may be a clearance between mating guide members of the guide and/or may be a transversal clearance relative to a track of the guide. In other words, a degree of freedom provided by the clearance may be oriented perpendicular to a direction of the track of the guide.

According to a further embodiment, in the operating position, a conductive portion of the differential pressure module is electrically isolated from the abutment portion. The charged particle optical apparatus may include a voltage source, which is configured to place the conductive portion at a pre-defined potential. The pre-defined potential may be different from a potential of the abutment portion.

According to a further embodiment, the charged-particle optical apparatus is configured to pivot the positioning arm about a pivoting axis. The pivoting axis may be arranged outside and/or inside of the specimen chamber.

According to an embodiment, the differential pressure module comprises a seal member for bringing the differential pressure module into sealing engagement during the positioning of the differential pressure module.

The seal member may comprise a deformable and/or resilient sealing element. Additionally or alternatively, the seal member may comprise a seating surface. The seating surface may mate with a mating seating surface provided at the abutment portion. The seating surface and/or the mating seating surface may be rigid. During the positioning of the differential pressure module, the seating member may be brought into attachment with a sealing member, which may be provided at the abutment portion. The positioning of the differential pressure module, the advancing movement and/or the pressing movement of the differential pressure module may bring the differential pressure module into sealing engagement with the abutment portion. The sealing element may be in the form of a single loop, such as a ring. In the operating position, the loop may surround the primary particle beam path. By way of example, the resilient sealing element is an O-ring. The O-ring may be made of Viton.

According to an embodiment, the differential pressure module comprises an intermediate vacuum zone, wherein in the operating position, the primary particle beam path passes through the intermediate vacuum zone.

The intermediate vacuum zone may comprise a vacuum port for evacuating the intermediate vacuum zone. At least when the differential pressure module is in the operating position, the vacuum port may be in fluid communication with a vacuum source. The vacuum source may be a vacuum pump. The vacuum port may be connected to the vacuum source via a vacuum line. The vacuum port may be arranged outside of the primary particle beam path. In other words, the primary particle beam path does not pass through the vacuum port. The vacuum line may be formed by the positioning arm and/or may be rigidly and/or movably attached to the positioning arm. The vacuum line may extend through an interior of the specimen chamber. The vacuum line may extend along at least a portion of the positioning arm. The vacuum line may be moved in conjunction with the track-guided movement of the positioning arm.

It is also conceivable that the vacuum line is rigidly connected to the particle optical arrangement. In such an embodiment, the vacuum zone of the differential pressure module may be brought into fluid communication with the vacuum line by the positioning of the differential pressure module into the operating position.

Through the differential pressure aperture, the primary particle beam path may exit from the intermediate vacuum zone and enter into the interior of the specimen chamber. The differential pressure module may comprise a further differential pressure aperture through which the primary particle beam path may enter into the intermediate vacuum zone.

According to a further embodiment, the differential pressure module comprises two intermediate vacuum zones. In the activation position of the differential pressure module, the primary particle beam path may pass sequentially through the two intermediate vacuum zones.

The two intermediate vacuum zones may be separated form each other by a separating differential pressure aperture. When the differential pressure module is in the operating position, the primary particle beam path may pass through the separating differential pressure aperture.

According to an embodiment, each of the two intermediate vacuum zones comprises a vacuum port for evacuating the respective vacuum zone. Each of the vacuum ports may be in fluid communication with a separate or common vacuum source. The charged particle optical apparatus may comprise a branched vacuum line having two branch lines. For each of the branch lines, an end of the respective branch line may open into a separate one of the two vacuum ports.

According to a further embodiment, in the operating position, the differential pressure aperture is located between a final magnetic lens of the particle optical arrangement and an object plane of the particle optical arrangement and/or between a principal plane of the final magnetic lens and the object plane. The term "between a final magnetic lens and the object plane" may be defined as being located between all pole pieces of the final magnetic lens on the one hand and the object plane on the other hand. The object plane may be located inside the specimen chamber. The particle optical arrangement may be configured to focus the primary particle beam on the object plane. The final magnetic lens may be defined as the last magnetic lens passed by the primary beam path. The final magnetic lens may be part of a combined magnetic-electrostatic lens. One or more electrostatic lenses may be disposed between the final magnetic lens and the object plane. The final magnetic lens may form at least a part of an objective lens of the particle optical arrangement.

According to a further embodiment, in the operating position, the differential pressure aperture is located between a final electrostatic lens of the particle optical arrangement and an object plane of the particle optical arrangement and/or between a principal plane of the final electrostatic lens and the object plane. The term "between a final electrostatic lens and the object plane" may be defined as being located between all electrodes of the final electrostatic lens on the one hand and the object plane on the other hand. The final electrostatic lens may be defined as the last electrostatic lens passed by the primary beam path. The final electrostatic lens may be part of a combined magnetic-electrostatic lens. One or more magnetic lenses may be disposed between the final electrostatic lens and the object plane.

According to a further embodiment, in the operating position, the differential pressure aperture is located between a final particle lens of the particle optical arrangement and an object plane of the particle optical arrangement and/or between a principal plane of the final particle lens and the object plane. The term "between a final particle lens and the object plane" may be defined as being located between all pole pieces and/or electrodes of the final particle lens on the one hand and the object plane on the other hand. The final particle lens may be a magnetic lens, an electrostatic lens and/or a combined magnetic-electrostatic lens.

According to a further embodiment, in the operating position, the differential pressure aperture is located between an objective lens of the particle optical arrangement and an object plane of the particle optical arrangement and/or between a principal plane of the objective lens and the object plane. The term "between the objective lens and the object plane" may be defined as being located between all pole pieces and/or electrodes of the objective lens on the one hand and the object plane on the other hand. The objective lens may be a magnetic lens, an electrostatic lens and/or a combined magnetic-electrostatic lens.

A distance between the object plane and the objective lens and/or a distance between the object plane and the principal plane of the objective lens may be greater than a distance between the object plane and the differential pressure aperture when the differential pressure module is in the operating position.

According to an embodiment, in the operating position, the differential pressure aperture is the only or a final differential pressure aperture through which the primary particle beam path passes. Through the differential pressure aperture, the primary particle beam path may enter into the interior of the specimen chamber.

According to a further embodiment, the differential pressure module comprises a guiding and/or supporting structure. The guiding and/or supporting structure may be configured to be engageable with a mating structure of the particle optical apparatus during the positioning of the differential pressure module. In other words, the positioning of the differential pressure module may bring the guiding and/or supporting structure into engagement with the mating structure.

The mating structure may be rigidly attached to the objective lens and/or attached to a component, which is rigidly connected to the objective lens. By way of example, the component is a housing, which at least partially accommodates the objective lens.

According to a further embodiment, the differential pressure module is selectively detachably coupled to the positioning arm. The particle optical apparatus may comprise a coupling system for coupling the differential pressure module to the positioning arm in a selectively detachable manner. The coupling system may be configured such that in the pressure-controlled interior of the specimen chamber (i.e. without venting the specimen chamber), the differential pressure module is selectively detachable and/or attachable to the positioning arm.

By way of example, the coupling system may comprise a coupling actuator, which is in signal communication with a controller of the particle optical apparatus. The controller may be configured to command the coupling actuator to selectively attach and/or detach the differential pressure module from the positioning arm.

According to an embodiment, the charged-particle optical apparatus further comprises a through-the-lens detector for detecting particles and/or radiation.

A through-the-lens detector may be defined herein as a detector, which is configured to detect emitted particles and/or radiation, which are emitted from the object, after the emitted particles and/or radiation have passed through a principal plane of a particle lens of the particle optical arrangement. The emitted particles may be object particles and/or primary particles. Additionally or alternatively, the through-the lens detector may be configured to detect radiation, such as cathodoluminescence radiation. The lens may be at least a portion of the objective lens. The through-the-lens particle detector may be configured to selectively detect primary particles and/or object particles.

According to a further embodiment, the charged-particle optical apparatus further comprises an aperture member. At least a portion of the aperture member may be conductive. At least a portion of the aperture member may be in the shape of a tapered tube. The tapered tube may taper towards the object. At least a portion of an inner peripheral surface and/or at least a portion of an outer peripheral surface of the aperture member may taper towards the object and/or may have a frustoconical shape. An object-side end portion of the aperture member may form at least a portion of the differential pressure aperture.

The differential pressure module may comprise a plurality of aperture members. For each of the aperture members, the respective aperture member may be in the shape of a tapered tube. Each of the aperture members may taper toward the object. The plurality of aperture members may form a plurality of vacuum zones.

According to a further embodiment, the particle optical apparatus comprises an objective lens. The advancing movement of the differential pressure module may represent a first path of the differential pressure module. At least a portion of the first path may be convex toward the objective lens. A starting point of the first path may be the non-operating position of the differential pressure module. The non-operating position may be defined as a position in which the differential pressure module is located at a distance from the primary particle beam path.

The differential pressure module may be brought into intersection with the primary particle beam path within the specimen chamber when following the first path.

According to a further embodiment, the first path is within a plane or is substantially within a plane. The plane may be oriented substantially parallel or oriented parallel to a direction of the primary particle beam path, wherein the direction of the primary beam path is measured at a location within the specimen chamber. Alternatively, the plane and the direction of the primary particle beam path may form an angle of less than 60 degrees, or less than 40 degrees, or less than 20 degrees, or less than 10 degrees, or less than 5 degrees.

According to a further embodiment, the first path is substantially linear over a length or linear over a length. The length over which the first path is linear or substantially linear may be at least 30 millimeters or at least 50 millimeters or at least 100 millimeters or at least 200 millimeters or at least 300 millimeters or at least 400 millimeters. The length over which the first path is substantially linear or linear may be less than 2000 millimeters or less than 1000 millimeters.

According to a further embodiment, the selective positioning of the differential pressure module includes performing a movement of the differential pressure module along a second path after completion of the first path. The second path may be a substantially linear path. The second path may be transverse or oblique or substantially perpendicular or perpendicular to the first path. An end point of the second path may be the operating position. At least a portion of the second path may be concave toward the positioning arm.

According to a further embodiment, the second path is substantially linear or linear over a length. The length over which the second path is substantially linear or linear may be least 1 millimeter or at least 3 millimeters or at least 5 millimeters or at least 10 millimeters or at least 20 millimeters. The length over which the second path is substantially linear or linear may be less than 200 millimeters or less than 100 millimeters.

According to a further embodiment, the length $L_1$ over which the first path is linear or substantially linear divided by the length $L_2$ over which the second path is linear or substantially linear (i.e. $L_1/L_2$) is greater than 5, or greater than 10, or greater than 30, or greater than 50, or greater than 100.

According to a further embodiment, the particle optical apparatus comprises a guide for guiding the track-guided movement of the positioning arm. The guide may include two mating guide members. The positioning arm may be movably connected to the guide to allow variation of an orientation of the positioning arm relative to each of the two mating guide members. The orientation of the positioning arm may be variable in a plane, which is substantially parallel or parallel to a direction of the primary particle beam path, wherein the direction of the primary particle beam path is measured at a location within the specimen chamber. The plane in which the orientation is variable may be parallel or substantially parallel to a plane in which the first path and/or the second path of the differential pressure module is located.

The first guide member may be configured as a rail, may form a guide track and/or may define a guiding path of the guide. The second guide member may be configured as a carriage and/or may be configured to be movable along the guiding path and/or the guide track. The positioning arm may be connected to at least one of the guide members of the guide at least in part via a resilient coupling and/or at least in part via an actuator. By way of example, the resilient coupling includes a spring.

According to a further embodiment, a degree of freedom of the positioning arm for performing at least a portion of the positioning of the differential pressure module is provided by the movable connection which movably connects the positioning arm to the guide to allow variation of the orientation of the positioning arm relative to each of the two mating guide members.

BRIEF DESCRIPTION OF THE DRAWINGS

The foregoing disclosure as well as other advantageous features will be more apparent from the following detailed description of exemplary embodiments with reference to the accompanying drawings. It is noted that not all possible embodiments necessarily exhibit each and every, or any, of the advantages identified herein.

FIGS. 7A and 7B schematically illustrate a particle optical apparatus according to a fourth exemplary embodiment;

FIG. 8 schematically illustrates a particle optical apparatus according to a fifth exemplary embodiment.

DETAILED DESCRIPTION OF EXEMPLARY EMBODIMENTS

Figure 1:
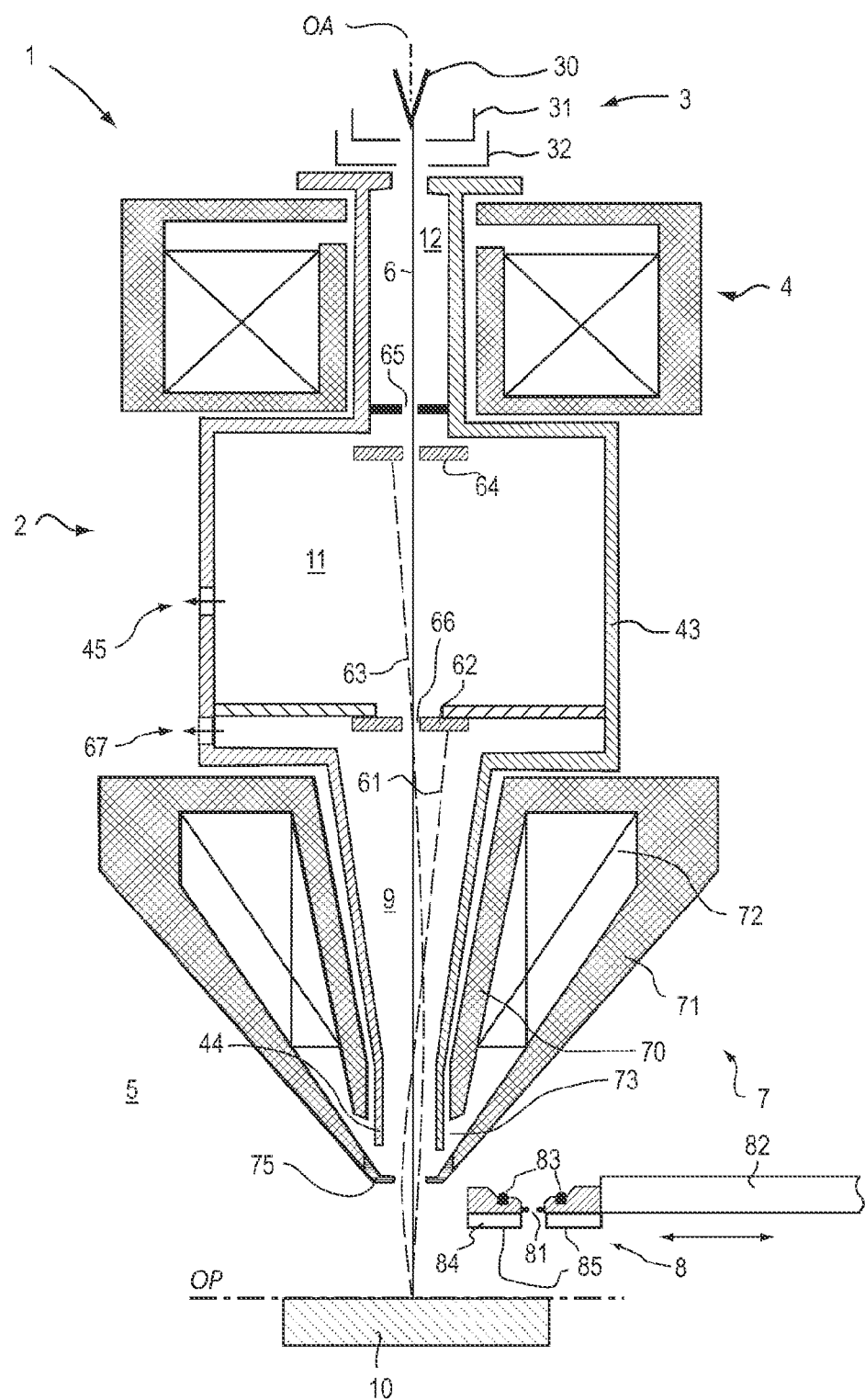
FIG. 1 schematically illustrates a particle optical apparatus according to a first exemplary embodiment.

FIG. 1 shows a particle optical apparatus 1 according to a first exemplary embodiment. The particle optical apparatus 1 is configured as a scanning electron microscope. The particle optical apparatus 1 includes a particle optical arrangement 2. The particle optical arrangement 2 includes a particle gun 3, a condenser lens 4, a beam booster 43, and an objective lens 7. The particle gun 3 includes a cathode 30, a suppressor electrode 31 and an extraction electrode 32. The cathode 30 may for example be configured as a Schottky field emitter. The particle optical arrangement 2 is configured to define a primary particle beam path 6. The primary particle beam path 6 extends between the cathode 30 and a surface of an object 10 to be inspected. The object 10 is disposed within a pressure-controlled interior 5 of a specimen chamber (not illustrated in FIG. 1).

The primary particle beam path 6 passes through the condenser lens 4 and the objective lens 7. The particle optical arrangement 2 is configured such that the primary particle beam is focused on an object plane OP of the particle optical arrangement 2, where the surface of the object 10 is arranged.

The beam booster 43 is configured to surround at least a portion of the primary particle beam within the particle optical arrangement. The beam booster 43 is placed at a positive potential relative to the cathode 30. Thereby, the particles of the primary particle beam 6 are guided through at least a portion of the particle optical arrangement 2 with a high kinetic energy such as a kinetic energy of 10 keV. Thereby, it is possible to keep spherical and chromatic aberrations of the primary particle beam low and to reduce the influence of unwanted interference fields.

The objective lens 7 includes a source side pole piece 70, an object-side pole piece 71 and an excitation coil 72 for generating a magnetic field in a pole piece gap 73 between the source side pole piece 70 and the object-side pole piece 71. The objective lens 7 further includes a first electrode 44, which is formed by an object-side end section of the beam booster 43 and a second electrode 75, which is attached to an object-side end portion of the object-side pole piece 71. Thereby, the objective lens 7 is a combined magnetic-electrostatic objective lens. The second electrode 75 may be electrically isolated from the object-side pole piece 71 such that the second electrode 75 can be placed at a potential, which is different from a potential of the object-side pole piece 71.

As a result of the impact of the primary electron beam onto the surface of the object 10, secondary electrons and backscattered electrons are generated. A portion of the generated secondary electrons 61 enter the objective lens 7 and are guided by the magnetic and electric fields of the objective lens 7 to a through-the-lens secondary electron detector 62. The through-the-lens secondary electron detector 62 includes an aperture 66, acting as a differential pressure aperture. Also a portion of the generated backscattered electrons 63 enter the objective lens 7 and are guided by the magnetic and electric fields of the objective lens 7 to a through-the-lens backscattered electron detector 64.

Figure 2:
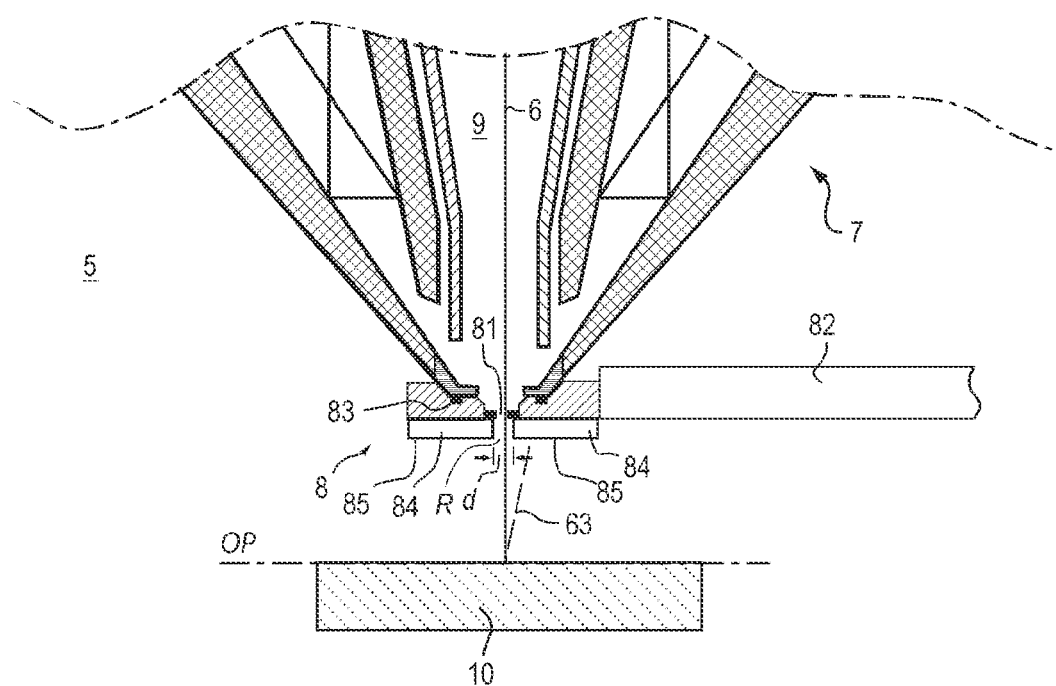
FIG. 2 schematically illustrates the particle optical apparatus according to the first exemplary embodiment, wherein the differential pressure module is in the operation position.

The particle optical apparatus 1 comprises a differential pressure module 8 having a differential pressure aperture 81. The differential pressure module 8 is rigidly attached to a positioning arm 82. For simplicity of illustration, the positioning arm 82 is not shown in cross-section. The positioning arm 82 is configured to selectively position the differential pressure module 8 within the pressure-controlled (i.e. evacuated) interior 5 of the specimen chamber into an operating position, which is illustrated in FIG. 2. In the operating position, the differential pressure aperture 81 is disposed between the objective lens 7 and the object plane OP, such that the primary particle beam path 6 passes through the differential pressure aperture 81.

As can be seen from FIG. 2, in the operating position of the differential pressure module 8, the primary particle beam path 6 enters into the interior 5 of the specimen chamber through the differential pressure aperture 81. In other words, as a result of the positioning of the differential pressure module into the operating position, a vacuum zone 9 is formed between the differential pressure aperture 81 and the differential pressure aperture 66 (illustrated in FIG. 1) provided by the through-the-lens secondary electron detector 62.

As is further illustrated in FIG. 1, the vacuum zone 9 is provided with a vacuum port 67 for evacuating the vacuum zone 9. The differential pressure aperture 66 provided by the through-the-lens secondary electron detector 62, separates the vacuum zone 9 from a further vacuum zone 11 in which the though-the-lens backscattered electron detector 64 is disposed and which is evacuated via vacuum port 45. The vacuum zone 11 is separated from the electron gun vacuum zone 12 by a further differential pressure aperture 65. For simplicity of illustration, the vacuum port of the electron gun vacuum zone 12 is not illustrated in FIG. 1.

The differential pressure module 8 includes a sealing element 83. The sealing element 83 allows sealingly engaging the differential pressure module 8 with the objective lens 7. In the illustrated exemplary embodiment, the sealing element 83 is made of a resilient material. The sealing element 83 is in the form of a single loop.

As is illustrated in FIG. 2, in the operating position of the differential pressure module 8, the sealing element 83 surrounds the primary particle beam path 6. The sealing element 83 may be an O-ring. The O-ring may be made of Viton. The sealing element 83 is pressed against the second electrode 75 (illustrated in FIG. 1) of the objective lens 7. Additionally or alternatively, the sealing element 83 may be pressed against other components of the particle optical arrangement, such as the pole piece of the objective lens 7 and/or a housing, which accommodates at least a portion of the objective lens 7.

The differential pressure module 8 includes a module-mounted particle detector 84. The module-mounted particle detector 84 may be configured to selectively detect secondary electrons and/or backscattered electrons. The module-mounted particle detector 84 may be configured as a semiconductor detector, a scintillator detector, a gaseous detector, a 4Q detector and/or a metal electrode detector for measuring the particle current impinging on the metal electrode.

The module-mounted particle detector 84 includes one or more particle receiving surfaces 85, which are arranged circumferentially around the primary particle beam path 6, thereby forming an inactive central region R through which the primary beam passes.

A width d of the inactive central region R may be greater than the width of the diameter of the differential pressure aperture 81. The width d of the inactive central region R may be less than the width of the differential pressure aperture 81 plus 0.5 millimeters, or plus 0.2 millimeters, or plus 0.1 millimeters. Thereby, it is possible to provide a module-mounted particle detector 84 having a high particle collection efficiency. Notably, particles, which can not enter the vacuum zone 9 as a result of the differential pressure module 8 being positioned in the operating position, and thereby also can not be detected by any one of the through-the-lens detectors 62, 64, have a high probability of being detected by the module-mounted detector 84.

Figure 3A:
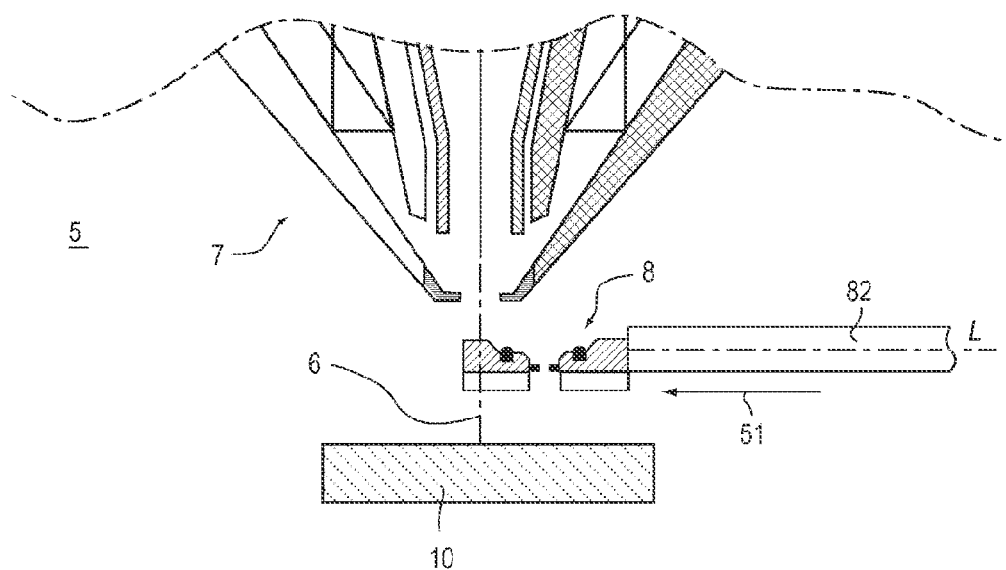
FIGS. 3A and 3B schematically illustrate the positioning of the differential pressure module in the particle optical apparatus according to the first exemplary embodiment.
Figure 3B:
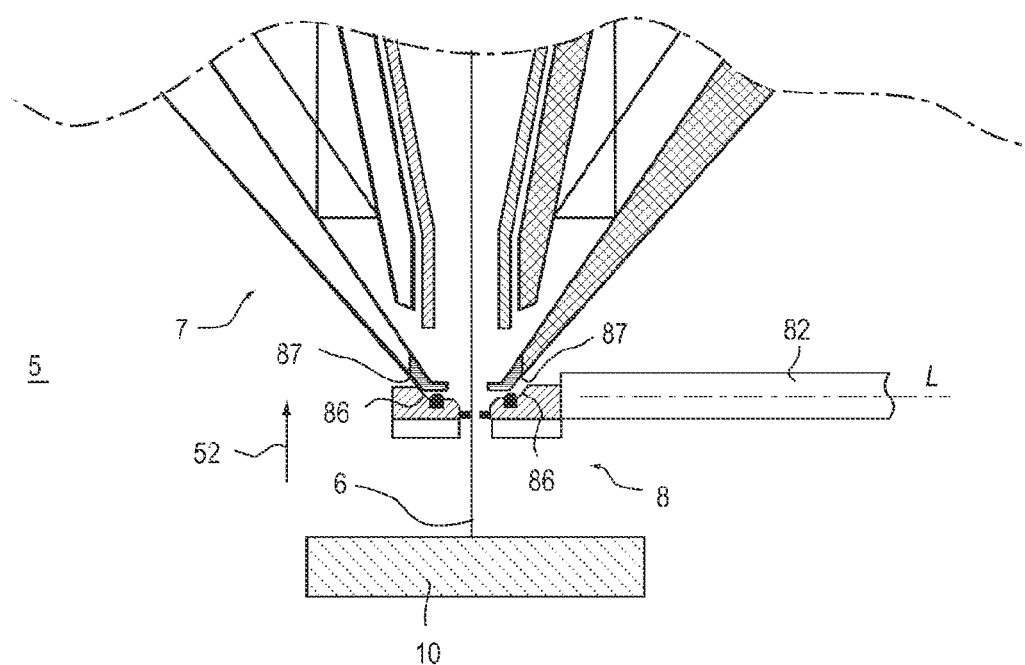

FIGS. 3A and 3B illustrate stages of the positioning process for positioning the differential pressure module 8 into the operating position. FIG. 3A illustrates an advancing movement for advancing the differential pressure module 8 in a direction toward the primary particle beam path 6. The direction of the advancing movement is schematically illustrated by arrow 51. Thereby, the differential pressure module is brought to a position close to the primary particle beam path 6.

The advancing movement is transmitted to the differential pressure module 8 by a track-guided movement of the positioning arm 82. The track-guided movement is performed substantially along a longitudinal axis L of the positioning arm 82. The track-guided movement of the positioning arm 82 is guided by a guide, which defines a curved and/or linear guiding path, such as a curved and/or linear track of a rail. By way of example, the track-guided movement is guided by a linear guide. This will be discussed in more detail below with reference to FIGS. 4, 9 and 10.

Accordingly, a particle optical apparatus is provided, which allows fast switching between two operation modes, which are provided for inspecting objects at different pressure level ranges in the interior 5 of the specimen chamber. By way of example, the first operation mode is configured for pressure levels of 0.01 Pa or lower in the specimen chamber and the second operation mode is configured for pressure levels higher than 0.01 Pa in the specimen chamber.

The track-guided movement of the positioning arm 82 allows rapidly advancing the differential pressure aperture 81 from a non-operating position to a position close to the primary particle beam path 6. In the non-operating position, the differential pressure module 8 is located at a distance from primary particle beam path 6. Furthermore, the track-guided movement of the positioning arm 82 requires only a small amount of space in the specimen chamber and therefore does not limit the space for further inspection and/or processing devices, which are disposed inside the specimen chamber, such as detectors or gas supply lines. Moreover, the track-guided movement of the positioning arm allows retracting the positioning arm and the differential pressure module when the differential pressure module 8 is transferred to the non-operating position. Thereby, ample space is left for the inspection and/or processing devices in the high-pressure operation mode.

During the advancing movement, the differential pressure module 8 is brought into intersection with the primary particle beam path 6, along which the primary particles travel when the primary beam is activated. This is schematically illustrated in FIG. 3A.

After completion of the advancing movement, a pressing movement of the differential pressure module 8 (schematically illustrated by arrow 52 in FIG. 3B) is performed for pressing the differential pressure module 8 against the objective lens 7. The pressing movement may be transmitted to the differential pressure module 8 by a substantially linear movement and/or by a rotational movement of the positioning arm 82. A direction of the pressing movement may be oriented substantially parallel to a direction of the primary particle beam path 6 inside the specimen chamber. Additionally or alternatively, it is conceivable that the pressing movement is transmitted to the differential pressure module 8 by a pivoting movement of positioning arm 82. A pivoting axis of the pivoting movement may be oriented substantially perpendicular to the primary particle beam path 6 inside the specimen chamber.

The final position of the pressing movement is the operating position, as shown in FIG. 2. The pressing movement causes the differential pressure module 8 to sealingly engage with the objective lens 7.

As will be described in detail with reference to FIGS. 7A and 7B, it is also conceivable that the pressing movement is omitted and the final position of the advancing movement is the operating position of the differential pressure module 8.

The differential pressure module 8 includes a guiding surface 86 for engagement with a guiding surface 87 of the objective lens 7. Thereby, the guiding surface 86 of the differential pressure module 8 represents a guiding structure, which is configured to be engageable with a mating structure, i.e. the guiding surface 87 of the objective lens 7. As is illustrated in FIG. 3B, the guiding surfaces 86, 87 are configured to guide the differential pressure module 8 into the operating position during the pressing movement. The guiding surface 86 of the differential pressure aperture is in the shape of a frustoconical inner peripheral surface and the guiding surface 87 of the objective lens is in the shape of a frustoconical outer peripheral surface. The guiding surfaces 86, 87 surround the primary particle beam path 6 and are slanted relative to the primary particle beam path 6.

The guiding surfaces 86, 87 allow to rapidly position the differential pressure aperture 81 relative to the particle optical arrangement 2 with high accuracy, even if the positioning arm 82 is flexible, e.g. due to a strongly elongated shape of the positioning arm 82.

Figure 4:
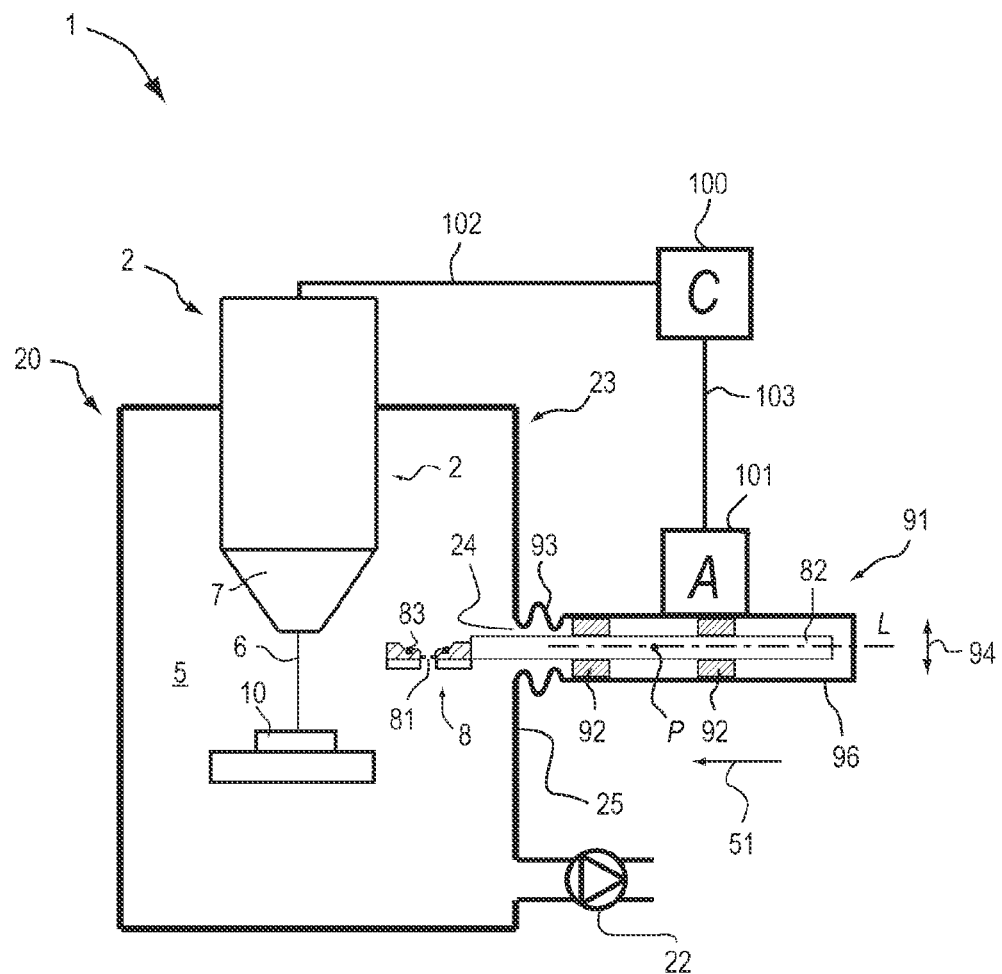
FIG. 4 schematically illustrates the specimen chamber of the particle optical apparatus according to the first exemplary embodiment.

In FIG. 4, it is illustrated how the positioning arm 82 is connected to the specimen chamber 20 of the charged particle optical apparatus 1 according to the first exemplary embodiment. The positioning arm 82 is movably supported by bearings 92. The bearings 92 are attached to an interior surface of an end portion 96 of a tube 91. For transmitting the advancing movement to the differential pressure module 8, the positioning arm 82 is guided by bearings 92 along the longitudinal axis of the positioning arm 82. Thereby, the positioning arm 82 defines a track for the track-guided movement of the positioning arm 82. In other words, the positioning arm 82 forms a rail for guiding the track-guided movement of the positioning arm 82.

The end portion 96 of the tube 91 is connected to a main chamber portion 23 of the specimen chamber 20 via a flexible tube portion 93. In the illustrated exemplary embodiment, the flexible tube portion 93 include bellows. The tube 91 therefore forms a part of the vacuum enclosure. In the main chamber portion 23, the object 10 is disposed for inspecting the object with the particle optical system 1. The main chamber portion 23 is in fluid communication with a vacuum pumping system 22 or other vacuum source. The interior of the tube 91 is in fluid communication with the interior of the main chamber portion 23 via an opening 24, which extends through a wall portion 25 of the main chamber portion 23. The tube 91 forms an extension of the opening 24.

During the advancing movement in the direction, which is schematically indicated by arrow 51, a portion of the positioning arm 82 passes through the opening 24. The flexible tube portion 93 is configured to allow the end portion 96 of the tube 91 to be moved relative to the main chamber portion 23 along a direction 94, which is substantially parallel to the primary particle beam path 6 inside the specimen chamber 20. This allows transmitting to the differential pressure module 8 the pressing movement for pressing the differential pressure module 8 against the objective lens 7. Additionally or alternatively, the pressing movement is transmitted to the differential pressure module 8 by a pivoting movement of the tube end portion 96 and/or the positioning arm 82 about a pivoting axis P. The pivoting axis P may be oriented substantially perpendicular to the primary particle beam path 6 inside the specimen chamber 20. The pivoting axis may be located outside of the specimen chamber 20. It is conceivable that the positioning arm 82 is moved or pivoted relative to the tube 91. This allows omitting the flexible tube portion 93.

The positioning arm 82 is in operative connection with an actuator 101. The actuator may be configured as an electric, pneumatic and/or hydraulic actuator. The actuator 101 is in signal communication via signal line 103 with a controller 100 of the charged particle optical apparatus 1. The controller 100 is also in signal communication with the particle optical arrangement 2. The controller 100 is configured to switch the particle optical apparatus 1 between the first and the second operation mode.

In the first operation mode, the differential pressure module 8 is disposed in the non-operating position in which the differential pressure module 8 is located at a distance from the primary particle beam path 6. In the second operation mode, the differential pressure module 8 is in the operating position (shown in FIG. 2), in which the primary particle beam path 6 enters into the main chamber portion 23 through the differential pressure aperture 81.

In the first operation mode, the interior 5 of the specimen chamber 20 has to be maintained at a high vacuum pressure level in order to ensure maintenance of a sufficiently low pressure level in the electron gun 3 (shown in FIG. 1).

However, the first operation mode is only of limited use for inspecting wet objects, which tend to increase the vacuum pressure level in the interior 5 of the specimen chamber 20. Further, the first operation mode also does not allow to selectively increase the vacuum pressure level in a significant manner in order to enable dissipation of surface charges when inspecting non-conductive objects. However, such measurements can be performed in the second operation mode, in which the differential pressure aperture 81 is arranged in the primary particle beam path 6.

On the other hand, compared to the second operation mode, the first operation mode allows detecting secondary particles and backscattered particles by the through-the-lens electron detectors 62, 64 (illustrated in FIG. 1) with a higher efficiency. The reason for this resides in the fact that in the first operation mode, the differential pressure aperture 81 does not block secondary and backscattered electrons from entering into the interior of the particle optical arrangement 2. Further, in the first operation mode, the field of view is not limited by the differential pressure aperture 81.

Upon receiving a mode switching command to switch to the second operation mode, the controller commands the particle optical arrangement to deactivate the primary particle beam. Then, controller 100 commands the actuator 101 to perform an advancing movement starting from the non-operating position of the differential pressure module 8. The advancing movement is configured to advance the differential pressure module 8 toward the primary particle beam path 6. After completion of the advancing movement, the controller 100 commands the actuator 101 to perform a pressing movement for pressing the differential pressure module 8 against the objective lens 7. By virtue of the pressing movement, the sealing member 83 sealingly engages with the objective lens 7. After completion of the pressing movement, the differential pressure module 8 is in the operating position, as shown in FIG. 2. Then, the controller commands the particle optical arrangement 2 to activate the primary particle beam.

Upon receiving a mode switching command to switch to the first operation mode, the controller 100 commands the particle optical apparatus to deactivate the particle beam. Then, the controller 100 commands the actuator 101 to move the differential pressure module 8 from the operating position to the non-operating position. These movements may include a reverse advancement movement and/or a reverse abutting movement.

Figure 5:
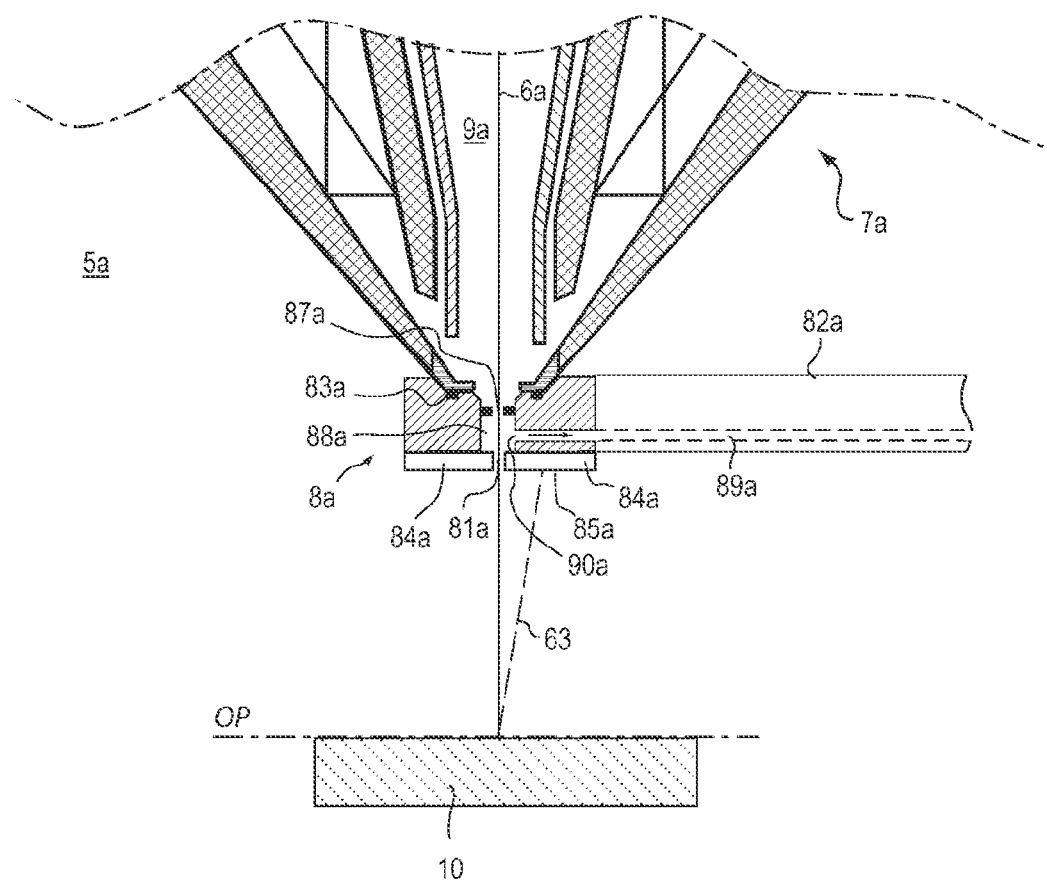
FIG. 5 schematically illustrates a particle optical apparatus according to a second exemplary embodiment.

FIG. 5 illustrates a charged particle optical apparatus according to a second exemplary embodiment. Components, which correspond to components of the particle optical apparatus, shown in FIGS. 1 to 4, with regard to their composition, their structure and/or function are generally designated with the same reference numerals, which however have a letter "a" to show differentiation.

The differential pressure module 8a includes an intermediate vacuum zone 88a. The intermediate vacuum zone 88a has a source side differential pressure aperture 87a and an object-side differential pressure aperture 81a. When the differential pressure module 8a is in the operating position, the primary particle beam path 6a passes through the intermediate vacuum zone 88a. Through the source side differential pressure aperture 87a, the primary particle beam path 6a enters into the intermediate vacuum zone 88a. Through the object-side differential pressure aperture 81a, the primary particle beam path 6a enters into the interior 5a of the specimen chamber.

Thereby, a charged particle optical apparatus is provided, which allows operation at even higher pressure levels in the specimen chamber.

The intermediate vacuum zone 88a has a vacuum port 90a for evacuating the intermediate vacuum zone 88a. The vacuum port 90a is in fluid communication with a vacuum source (not shown in FIG. 5) via a vacuum line 89a. The vacuum line 89a may pass through the interior 5a of the specimen chamber. The vacuum line 89a may be formed by the positioning arm 82a and/or may be rigidly attached to the positioning arm 82a. The vacuum line 89a may be moved substantially in conjunction with the positioning arm 82a.

However, it is also conceivable that the vacuum line is rigidly connected to the particle optical arrangement. In such an alternative exemplary embodiment, the vacuum zone may be brought in fluid communication with the vacuum line during the positioning of the differential pressure module into the operating position.

In the second exemplary embodiment which is shown in FIG. 5, the differential pressure aperture 81a is formed by a component of the module-mounted detector 84a. The component is configured to contribute to generating a detector signal in response to receiving particles on the particle receiving surface 85a of the module-mounted particle detector.

Accordingly, a module-mounted particle detector 84 is provided having a high collection efficiency. Notably, particles, which can not enter the vacuum zone 9a as a result of the differential pressure module 8a being positioned in the operating position, and thereby also can not be detected by any one of the through-the-lens detectors have a high probability of being detected by the module-mounted detector 84a.

By way of example, the module-mounted particle detector 84a is configured as a semiconductor particle detector and/or a scintillator detector. The differential pressure aperture 81a may be formed in a semiconductor substrate of a semiconductor particle detector. The semiconductor substrate may form at least part of a diode of the semiconductor particle detector. It is also conceivable that the differential pressure aperture 81a is formed in a scintillator of the module-mounted detector 84a.

In the module-mounted particle detector of the second exemplary embodiment, it is also conceivable that the differential pressure aperture 81a is formed by a component, which is not part of the semiconductor particle detector 84a, such as in the module-mounted particle detector of the first exemplary embodiment, which is illustrated in FIGS. 1 to 4. It is also conceivable that the vacuum port 90a and/or the vacuum line 89a are omitted.

Figure 6:
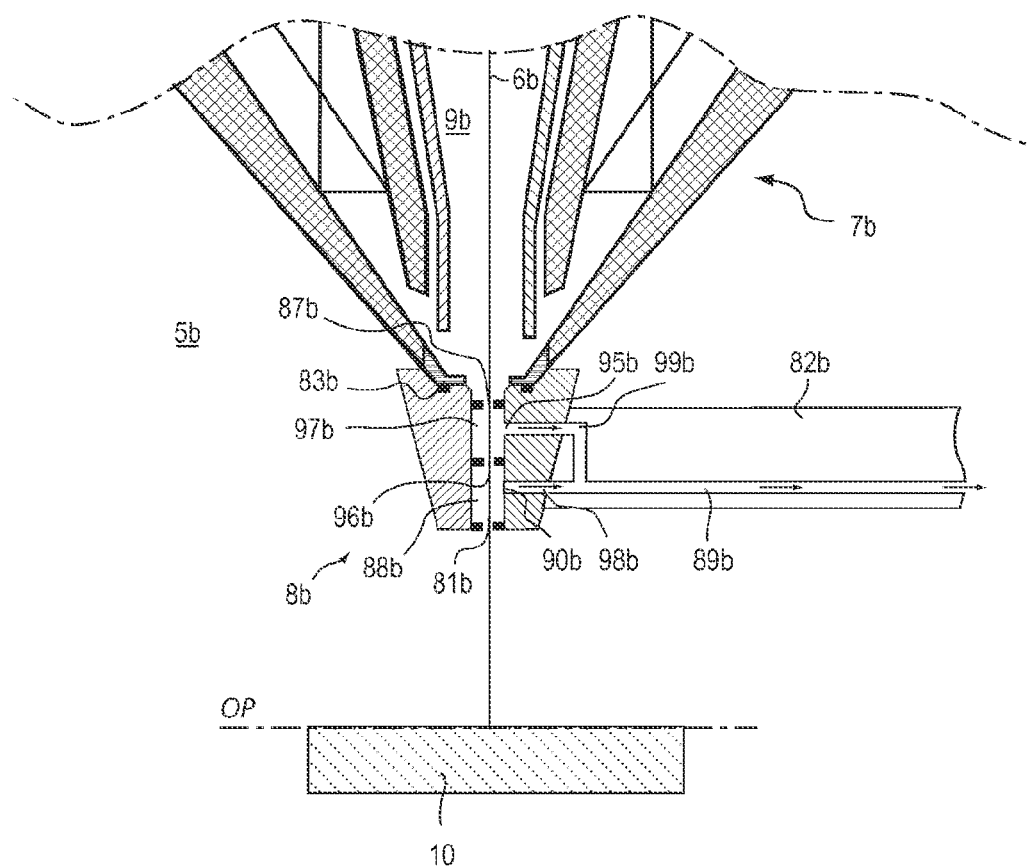
FIG. 6 schematically illustrates a particle optical apparatus according to a third exemplary embodiment.

FIG. 6 illustrates a charged particle optical apparatus according to a third exemplary embodiment. Components, which correspond to components of the first and second exemplary embodiment, shown in FIGS. 1 to 5, with regard to their composition, their structure and/or function are generally designated with the same reference numerals, which however have a letter "b" to show differentiation.

In the charged particle optical apparatus shown in FIG. 6, the differential pressure module 8b includes a first and a second vacuum zone 88b, 97b. The first and the second vacuum zones 88b, 97b constitute a series of vacuum zones, through which the primary particle beam path 6B passes successively. The primary particle beam path 6b enters into the second vacuum zone 97b through differential pressure aperture 87b. Then, the primary particle beam path 6b passes from the second vacuum zone 97b to the first vacuum zone 88b through a separating differential pressure aperture 96b, which separates the first vacuum zone 88b from the second vacuum zone 97b. Then, the primary particle beam path 6b passes from the first vacuum zone 88b into the interior 5b of the specimen chamber through the differential pressure aperture 81b.

Each of the first and the second vacuum zones 88b, 97b includes a vacuum port 90b, 95b for evacuating the respective vacuum zone. Each of the vacuum ports 90b, 95b is in fluid communication with a common branched vacuum line 89b connected to a vacuum source (not shown in FIG. 6). The common branched vacuum line 89b includes a first branch line 98b and a second branch line 99b. An end of the first branch line 98b opens into the vacuum port 90b of the first vacuum zone 88b. An end of the second branch line 99b opens into the vacuum port 95b of the second vacuum zone 97b. The branch lines 98b, 99b are connected to each other inside the specimen chamber 20.

The common vacuum line 89b may be attached to the positioning arm 82b and/or formed by the positioning arm 82b in a same manner as the vacuum line 89a of the second exemplary embodiment shown in FIG. 5.

It has been shown that effective differential pumping can be provided without providing a separate vacuum line for each of the vacuum zone 88b, 97b connecting the respective vacuum zone to a separate vacuum source.

It is conceivable that also the differential pressure module 8b of the third exemplary embodiment shown in FIG. 6 is provided with a module-mounted particle detector, such as in the first and second exemplary embodiments, shown in FIGS. 1 to 5. It is further conceivable that in the differential pressure module 8b of the third exemplary embodiment, one or all of the vacuum ports 90b, 95b and/or the vacuum line 89b are omitted.

FIGS. 7A and 7B illustrate a fourth exemplary embodiment of the particle optical apparatus. Components, which correspond to components of the first to third exemplary embodiment, shown in FIGS. 1 to 6, with regard to their composition, their structure and/or function are generally designated with the same reference numerals, which however have a letter "c" to show differentiation.

The particle optical apparatus 1c according to the fourth embodiment includes a guiding and supporting arrangement for guiding the differential pressure module 8c during the positioning process into the operating position and for supporting the differential pressure module 8c in the operating position.

FIG. 7A shows a cross-sectional view taken perpendicular to the longitudinal axis L (shown in FIG. 7B) of the positioning arm 82c. In FIG. 7A, the differential pressure module 8c is in the operating position. FIG. 7B shows a cross-sectional view taken along the longitudinal axis L of the positioning arm 82c. In FIG. 7B, the differential pressure module 8c is shown during the advancing movement toward the primary particle beam path 6c. In FIG. 7B, the differential pressure module 8c and the positioning arm 82c are not shown in cross-section.

The differential pressure module 8c includes a guiding and supporting structure, which is configured to be engageable with a mating structure of the particle optical apparatus during the advancing movement.

The guiding and supporting structure provided at the differential pressure module 8c includes grooves 108c, 109c, which are formed in opposing sides of the differential pressure module 8c. The grooves 108c, 109c extend in a direction substantially oriented perpendicular to the beam path 6c of the primary particle beam 6c.

The mating structure 105c includes a pair of tabs 106c, 107c and a pair of attaching members 110c, 111c for attaching the tabs 106c, 107c to the objective lens 7c. Each of the tabs 106c, 107c extends from one of the attaching members 110c, 111c toward the primary particle beam path 6c in a plane substantially perpendicular to the primary particle beam path 6c inside the specimen chamber.

During the advancing movement of the differential pressure module 8c, the tabs 106c, 107c engage the grooves 108c, 109c. When the differential pressure module 8c is in the operating position, the differential pressure module 8c is supported by the guiding and/or supporting arrangement. This allows omitting the pressing movement for pressing the differential pressure module against the objective lens, as is illustrated in FIG. 3B for the first exemplary embodiment. Hence, the final position of the advancing movement is the operating position.

The differential pressure module 8c may be configured to be selectively detachably coupled to the positioning arm 82c, such that the differential pressure module 8c can be released from the positioning arm 82c in the pressure-controlled interior of the vacuum chamber (i.e. without venting the chamber). After the differential pressure module 8c has been released from the positioning arm 82c, the positioning arm 82 can be retracted and the differential pressure module is held in the operating position by the guiding and/or supporting arrangement.

Thereby, measurements in the second operation mode can be performed with the positioning arm 82c in a retracted position. This increases the available space for detectors and gas supply systems.

FIG. 8 illustrates a fifth exemplary embodiment of the particle optical apparatus. Components, which correspond to components of the first to fourth exemplary embodiment, shown in FIGS. 1 to 7B, with regard to their composition, their structure and/or function are generally designated with the same reference numerals, which however have a letter "d" to show differentiation.

The differential pressure module 8d of the fifth exemplary embodiment comprises an aperture member 112d. A portion of the aperture member 112d is in the shape of a tapered tube, which tapers toward the object 10. The aperture member has an outer peripheral surface 127d and an inner peripheral surface 128d, each tapering towards the object. An object-side end portion of the aperture member forms the differential pressure aperture 81d. Through the tapered form of the outer peripheral surface 127d, a comparatively large collection solid angle region $\Omega$ is provided for particle and/or radiation detectors, which are configured to detect particles and/or radiation, which are emitted from the interaction region 13 where the primary particle beam interacts with the object 10. Examples for such radiation detectors are EDX (energy dispersive X-ray) detectors and WDS (wavelength dispersive spectroscopy) detectors.

The tapered form of the aperture member 112d further allows placing the differential pressure aperture 81d comparatively close to the object plane OP of the particle optical arrangement. Thereby, the segment of the primary particle beam path 6d, which traverses the vacuum zone of the interior 5d of the specimen chamber is comparatively short. This allows efficient use of electron beams with low kinetic energies (even with energies as low as 1 keV), which have a comparatively short mean free path in the interior 5d of the specimen chamber, especially if the interior 5d of the specimen chamber is maintained at an elevated pressure level, such as in the second operation mode.

An insulating portion 113d is provided, which isolates the aperture member 112d and the positioning arm 82d from the second electrode 75d of the objective lens 7d. Furthermore, between the differential pressure module 8d and the positioning arm 82d, a further insulating portion 114d is provided to electrically isolate the differential pressure module 8d from the positioning arm 82d. Thereby, it is possible to place the aperture member 112d at a potential, which is different from a potential of the second electrode 75d, with which the differential pressure module 8d is brought into abutment. This allows generating an electrostatic field between the aperture member 112d and the second electrode 75d such that the beam path of the secondary and/or back-scattered particles is altered in such a way as to increase the collection efficiency of the through the lens detectors.

In the exemplary embodiment, which is shown in FIG. 8, the outer peripheral surface 127d of the aperture member 112d substantially forms an extension of an outer surface 129d of the objective lens 7d. Thereby, end portions 78d of the second electrode 75d, which face the primary beam 6d can be disposed at a comparatively large distance from the inner peripheral surface 128d of the aperture member 112d. It has been shown that this configuration allows generating an electrostatic field between the aperture member 112d and the second electrode 75d such that a high collection efficiency for the through the lens detectors can be attained.

It has further been shown that the shape of the outer peripheral surface 127d of the aperture member 112d as well as the adjustable potential of the aperture member 112d allows generating an electric field between the aperture member 112d and the object 10 such that a comparatively large portion of the secondary electrons, which are emitted from the interaction region 13, is guided through the differential pressure aperture 81d. Moreover, it is further possible to adapt the potential of the aperture member 112d relative to the object 10 such that an avalanche of electrons is generated in the region between the object 10 and the aperture member 112d. Thereby, it is possible to further increase the signal intensity.

Figure 9:
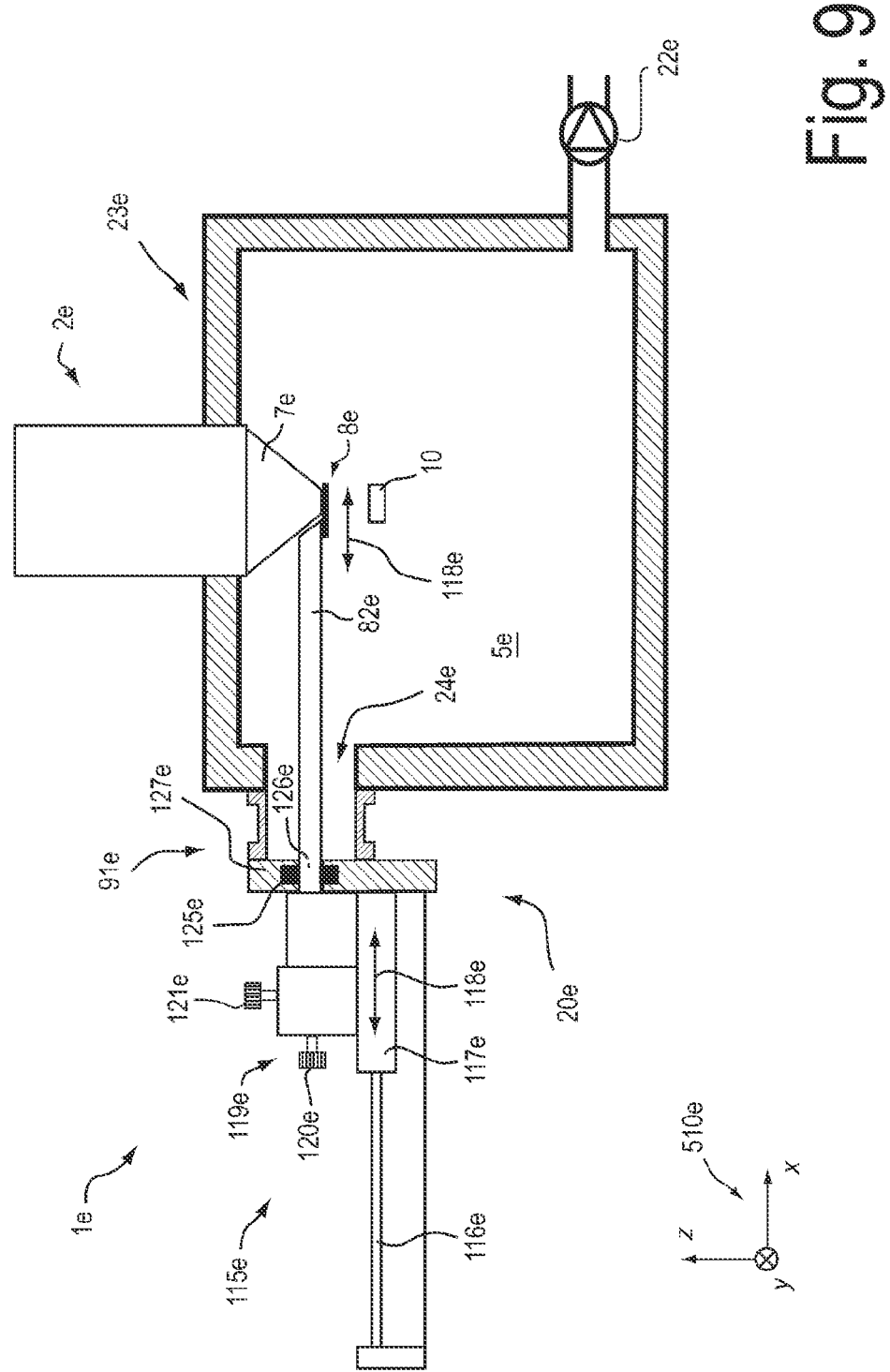
FIGS. 9 and 10 schematically illustrate a particle optical apparatus according to a sixth exemplary embodiment.
Figure 10:
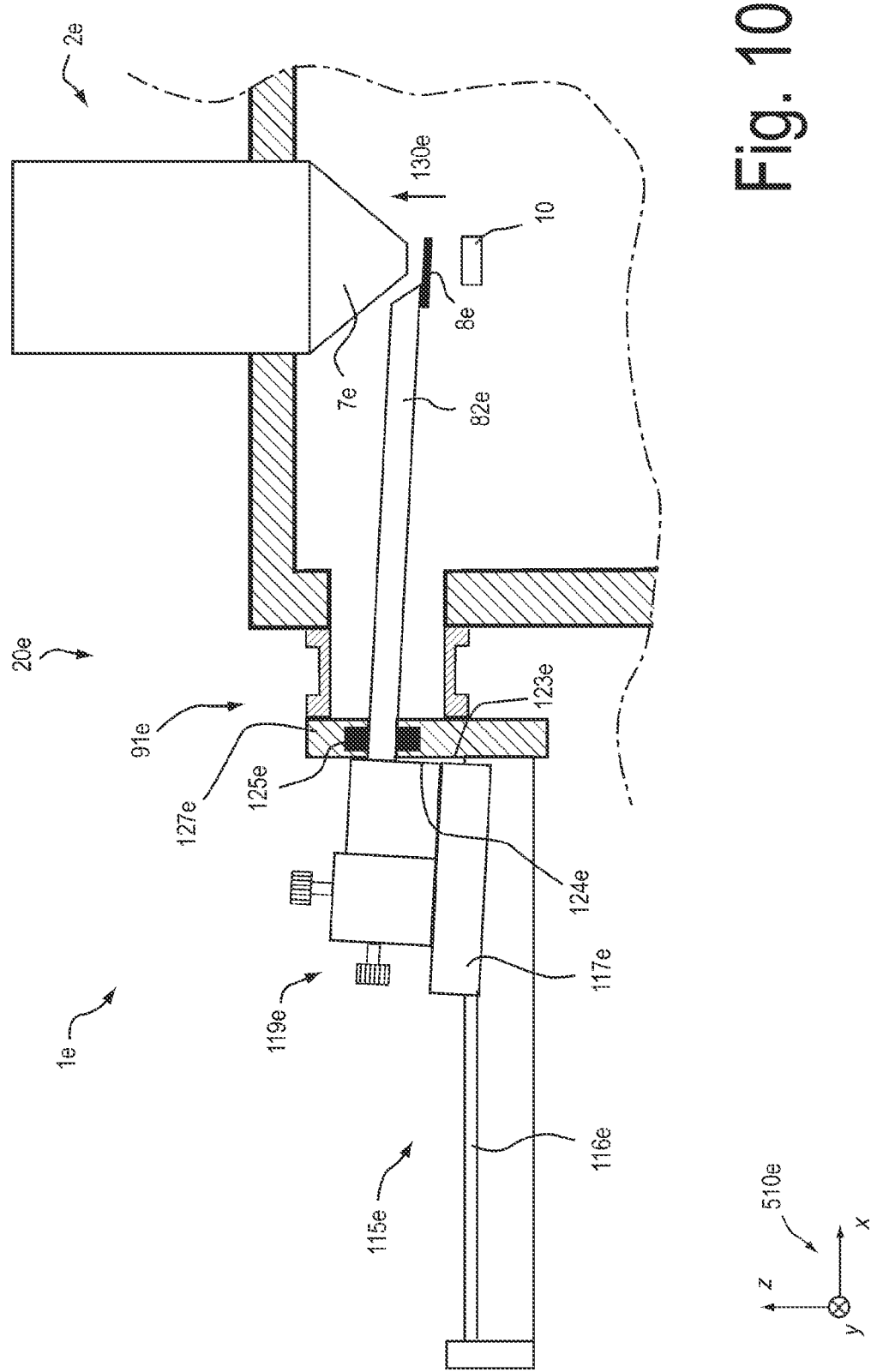

FIGS. 9 and 10 illustrate a sixth exemplary embodiment of the particle optical apparatus. Components, which correspond to components of the first to fifth exemplary embodiment, shown in FIGS. 1 to 8, with regard to their composition, their structure and/or function are generally designated with the same reference numerals, which however have a letter "e" to show differentiation.

The particle optical apparatus 1e according to the sixth exemplary embodiment includes a guide 115e. The guide 115e includes a carriage 117e and a guide rail 116e. The carriage 117e is movably supported by the guide rail 116e for linear movement along the guide rail 116e. The guide rail 116e has a linear guide track. The linear movement is schematically illustrated by arrow 118e. A carriage-side end of the positioning arm 82e is rigidly and adjustably attached to the carriage 117e. The adjustable connection is provided by an adjustment system 119e, which includes one or more adjustment screws 120e, 121e. The adjustment screws 120e, 121e are accessible from outside the specimen chamber 20e. The adjustment system 119e is configured such that a position and/or orientation of the positioning arm 82e relative to the carriage 117e is adjustable. Thereby, it is possible for the user to adjust the operating position of the differential pressure module 8e. This ensures that the differential pressure aperture has a correct position relative to the abutment portion of the objective lens 7e and relative to the primary particle beam path.

The positioning arm 82e extends through the vacuum enclosure by extending through an opening 126e. The opening 126e extends through a wall portion 127e of the specimen chamber 20e. The wall portion 127e is connected to the main chamber portion 23e via the tube 91e. Thereby, in the sixth exemplary embodiment, the positioning arm 82e extends through openings 24e, 126e, each of which extending through wall portions of the specimen chamber 20e.

By moving the carriage 117e along the guide rail 116e, advancing movements and retracting movements of the positioning arm 82e can be performed in directions toward and away from the primary particle beam path. The advancing and retracting movements are schematically illustrated by arrow 118e. Thereby, the advancing movement is transmitted to the differential pressure module 8*e* by a track-guided movement of the positioning arm 82*e*.

The guide rail 116*e* and the carriage 117*e* are disposed in the surrounding atmosphere of the particle optical apparatus 1*e*. This allows providing a massive and robust structure for the guide rail 116*e* and the carriage 117*e*, such that a fast positioning process and a high level of position accuracy is ensured.

Between the wall portion 127*e* and the positioning arm 82*e*, a sealing and bearing member 125*e* is provided, which movably supports the positioning arm 82*e*. Thereby, also the sealing and bearing member as well as the positioning arm 82*e* form part of the guide 115*e* for guiding the track-guided movement of the positioning arm 82*e*.

FIG. 10 illustrates how the pressing movement is performed for pressing the differential pressure module 8*e* against the abutment portion of the objective lens 7*e*.

A guide clearance between the carriage 117*e* and the rail 116*e* causes the differential pressure module 8*e* to move downward when the carriage 117*e* approaches a first abutment surface 123*e* which is rigidly connected to the specimen chamber 20*e*. In FIG. 10, this is illustrated in an exaggerated manner. Further moving the carriage 117*e* in a direction toward the specimen chamber 20*e* brings the first abutment surface 123*e* into abutment with a second abutment surface 124*e*, which is rigidly connected to the positioning arm 82*e*. Thereby, the first abutment surface 123*e* can be brought into alignment with the second abutment surface 124*e*. This causes the differential pressure module 8*e* to be pressed against the abutment portion of the objective lens 7*e*, as is schematically illustrated by arrow 130*e*.

Accordingly, a degree of freedom of the positioning arm 82*e* for pressing the differential pressure module 8*e* against the abutment portion of the objective lens 7*e* is provided by a guide clearance of the guide 115*e*. The guide clearance is a clearance between the guide rail 116*e* and the carriage 117*e*, i.e. between mating guide members of the guide 115*e*. The guide clearance is a transversal clearance relative to the track of the guide rail 116*e*.

Thereby, a robust and efficient apparatus is provided for rapidly positioning the differential pressure module into the operating position with high accuracy.

Figure 14:
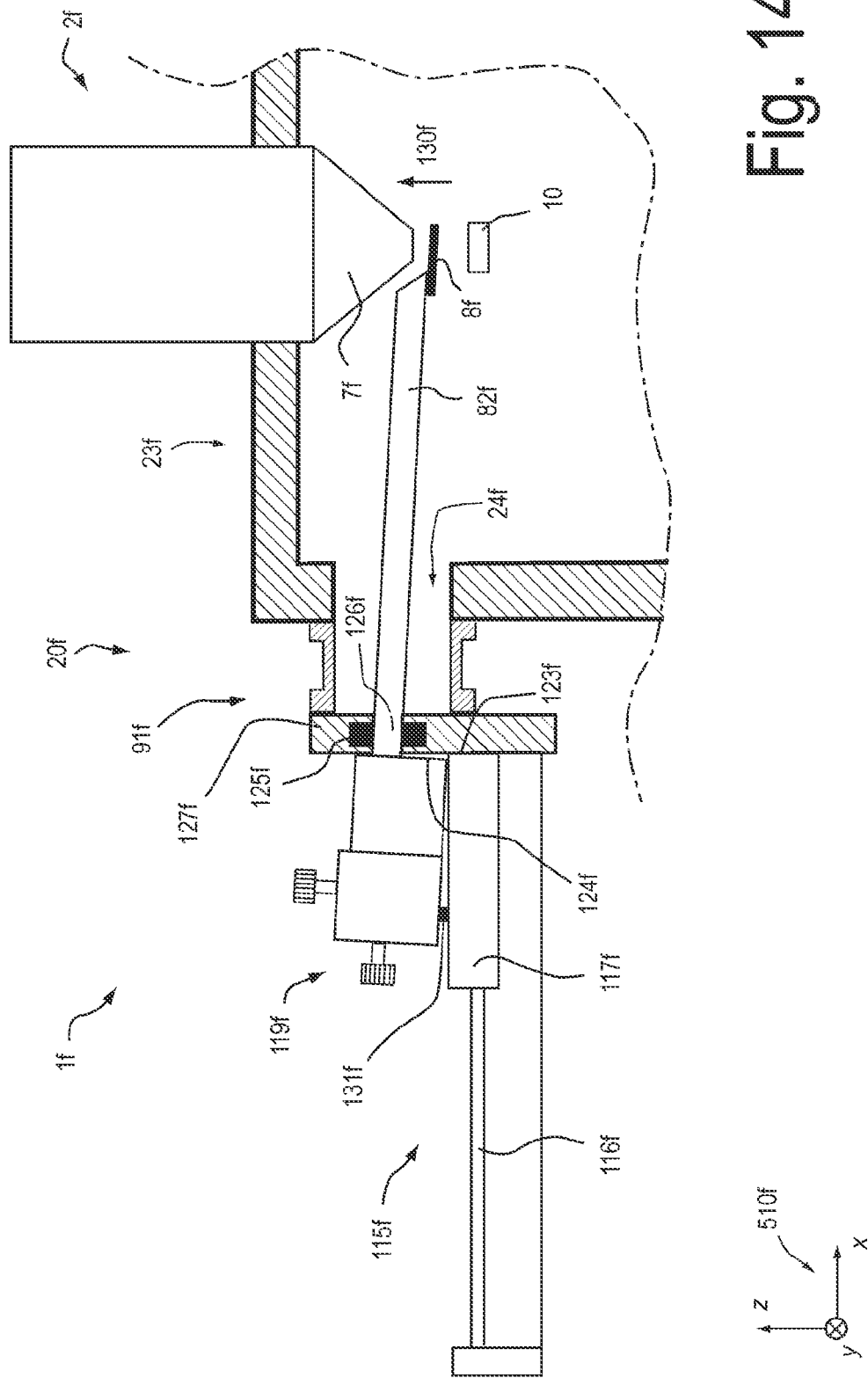
FIG. 14 schematically illustrates a particle optical apparatus according to a seventh exemplary embodiment.

FIG. 14 illustrates a seventh exemplary embodiment of the particle optical apparatus. Components of the seventh exemplary embodiment, which correspond to components of the first to sixth exemplary embodiment, shown in FIGS. 1 to 10, with regard to their composition, their structure and/or function are generally designated with the same reference numerals, which however have a letter "f" to show differentiation.

In the particle optical apparatus of the seventh exemplary embodiment, the positioning arm 82*f* is movably connected to the carriage 117*f* so that an orientation of the positioning arm 82*f* is variable relative to the carriage 117*f*. The orientation of the positioning arm 82*f* may be variable within a plane, which is oriented parallel or substantially parallel to a direction of the primary particle beam path, wherein the direction of the primary particle beam path is measured at a location within the specimen chamber. Due to the variable orientation of the positioning arm 82*f* relative to the carriage 117*f*, the differential pressure module 8*f* moves downward when the carriage 177*f* approaches the first abutment surface 123*f* which is rigidly connected to the specimen chamber 20*f*. Further moving the carriage 117*f* in a direction toward the specimen chamber 20*f* brings the first abutment surface 123*f* into abutment with the second abutment surface 124*f*, which is rigidly connected to the positioning arm 82*f*.

Pressing the second abutment surface 124*f* against the first abutment surface 123*f*, the second abutment surface 124*f* can be brought into alignment with or into a well-defined orientation relative to the first abutment surface 123*f*. This causes the differential pressure module 8*f* to move toward the objective lens 7*f*. Additionally or alternatively, this causes the differential pressure module 8*f* to be pressed against the abutment portion. In FIG. 14, this is schematically illustrated by arrow 130*f*. The alignment and/or the well-defined orientation may be defined by the structure of the first and second abutment surfaces 124*f* and 123*f*.

Therefore, in the seventh exemplary embodiment, a degree of freedom of the positioning arm 82*f* for pressing the differential pressure module 8*f* against the abutment portion is provided by a movable connection provided between the carriage 117*f* and the positioning arm 82*f*, wherein the moveable connection allows variation of an orientation of the positioning arm 82*f* relative to the carriage 117*f* and relative to the guide rail 116*f*. Therefore, due to the movable connection, when the carriage 117*f* approaches the first abutment surface 123*f*, the differential pressure module 8*f* moves downward.

In the seventh exemplary embodiment, the positioning arm 82*f* is at least in part resiliently coupled to the carriage 117*f*. By way of example, the resilient coupling includes a spring. Additionally or alternatively, the positioning arm 82*f* may be connected to the carriage 117*f* at least in part via an actuator. In FIG. 14, the actuator and/or the resilient coupling is designated with reference number 131*f*. The resilient coupling and/or the actuator 131*f* are configured to generate a force for moving a differential-pressure-module-sided end of the positioning arm downward as the end approaches the particle beam path. This is described in detail with reference to FIG. 12.

Figure 11B:
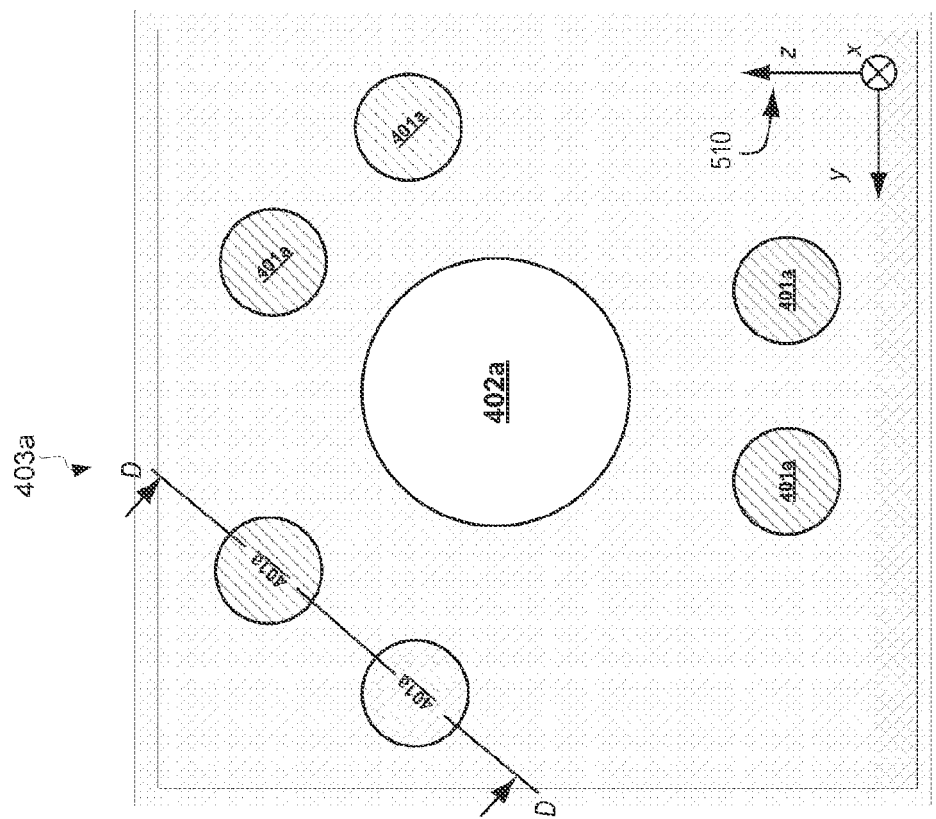
FIG. 11B schematically illustrates a further stopping face of the specimen chamber according to the eighth exemplary embodiment.
Figure 11A:
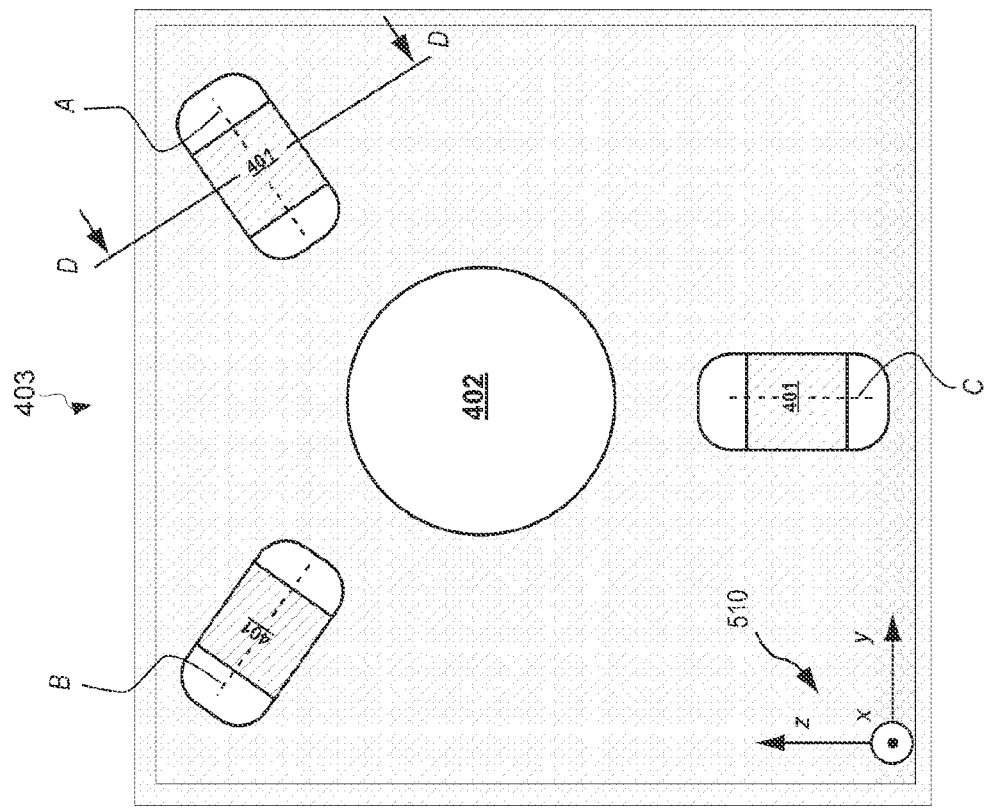
FIG. 11A schematically illustrates a stopping face of the carriage according to an eighth exemplary embodiment.

FIGS. 11A to 13 illustrate an eighth exemplary embodiment of the particle optical apparatus. The eighth exemplary embodiment is similar to the sixth and seventh exemplary embodiments which were described with reference to FIGS. 9, 10 and 14. In the eighth exemplary embodiment, the first abutment surface (which is indicated in the sixth and seventh exemplary embodiment with reference numerals 123*e* and 123*f*, respectively) is configured as a stopping face 403*a*, as schematically shown in FIG. 11B. Furthermore, in the eighth exemplary embodiment, the second abutment surface (which is indicated in the sixth and seventh exemplary embodiment with reference numerals 124*e* and 124*f*, respectively) is configured as stopping face 403, as shown in FIG. 11A. However, it is also conceivable that the first abutment surface is configured as stopping face 403 and the second abutment surface is configured as stopping face 403*a*.

In FIGS. 11A and 11B, the right-handed coordinate systems are indicated with reference numeral 510. This coordinate system corresponds to the right-handed coordinate systems 510*e* and 510*f*, which are shown in FIGS. 9, 10 and 14.

Stopping face 403 is rigidly coupled to the positioning arm and/or the carriage, which—in the sixth and seventh exemplary embodiment shown in FIGS. 9, 10 and 14—is indicated with reference numerals 117*e* and 117*f*, respectively. Further, stopping face 403*a* is rigidly coupled to the objective lens and/or the specimen chamber, which—in the sixth and seventh exemplary embodiment—is indicated with reference numerals 20*e* and 20*f*, respectively. However, it is also conceivable that stopping face 403*a* is rigidly coupled to the positioning arm and/or the carriage and stopping face 403 is rigidly coupled to the objective lens and/or the specimen chamber.

Stopping face 403 includes a bearing element 401 and stopping face 403a includes a bearing element 403a, which is configured as a counter bearing element for bearing element 401 of stopping face 403. The bearing elements 401 and 401a cooperatively form a positioning bearing. The positioning bearing is configured to position the positioning arm into a final position in which the differential pressure module is in the operating position. In the operating position, the differential pressure module may abut against the abutment portion.

As is shown in FIG. 11A, bearing element 401 includes a plurality of protrusions, each of which conforming to the shape of a portion of a cylinder. In the eighth exemplary embodiment, three protrusions are provided. The protrusions are arranged circumferentially around opening 402. In FIG. 11A, the axes of the cylinders are indicated with reference numerals A, B and C. These axes therefore represent symmetry axes of the shapes of the protrusions. Each of the axis is substantially oriented in a radial direction relative to an axis of an opening 402 of the stopping face 403.

As is shown in FIG. 11B, Stopping face 403a includes a bearing element 401a, which includes a plurality of protrusions. The plurality of protrusions are arranged circumferentially around opening 402a. In the eighth exemplary embodiment, bearing element 401a has three pairs of protrusion. For each of the pairs of protrusions, each individual protrusion conforms to the shape of a portion of a sphere. Each one of the pairs of protrusions is configured to support one of the protrusions of bearing element 401 of stopping face 403.

Thereby, the bearing elements 401 and 401a are configured to cooperatively form a positioning bearing, which guides the positioning arm into a final position in which the stopping face 403 has a well defined position and orientation relative to stopping face 403a. In the final position of the positioning arm, the differential pressure module is in the operating position.

The positioning arm may extend from the carriage through opening 402 of stopping face 403. Similarly, stopping face 403a may also contain a corresponding opening 402a for the positioning arm to enter specimen chamber.

Stopping face 403a may be implemented in the bearing member, which is indicated in FIGS. 9, 10 and 14 with reference numerals 125e and 125f, respectively. Additionally or alternatively, the stopping face 403a may be implemented in the first abutment surface, and/or the wall portion, which is indicated in FIGS. 9, 10 and 14 with reference numeral 127e. Additionally or alternatively, the stopping face 403 may be implemented in any other area where carriage may come into contact with specimen chamber.

Figure 12:
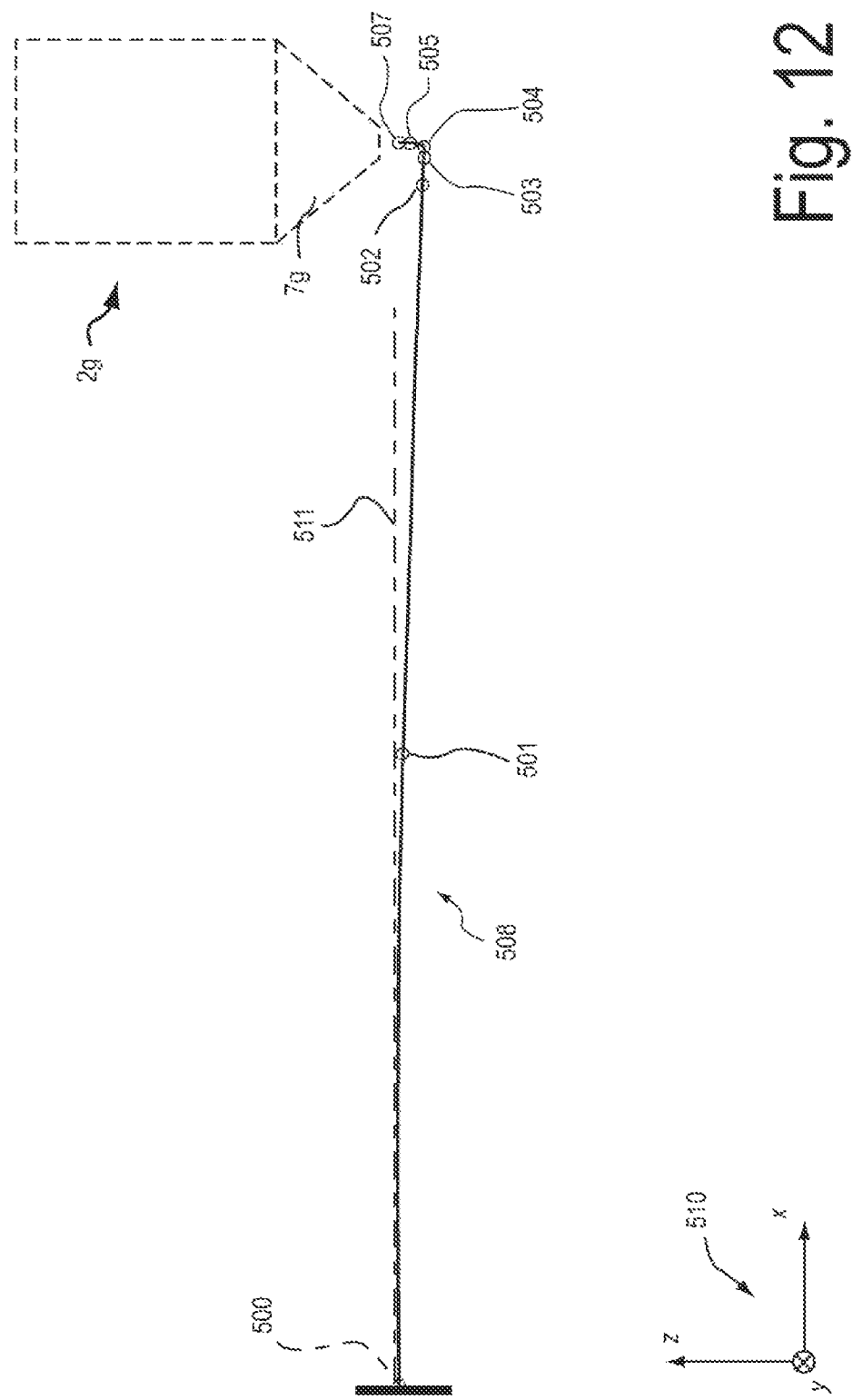
FIG. 12 schematically illustrates a exemplary movement path of the differential pressure module according to the sixth, seventh and eighth exemplary embodiments.
Figure 13:
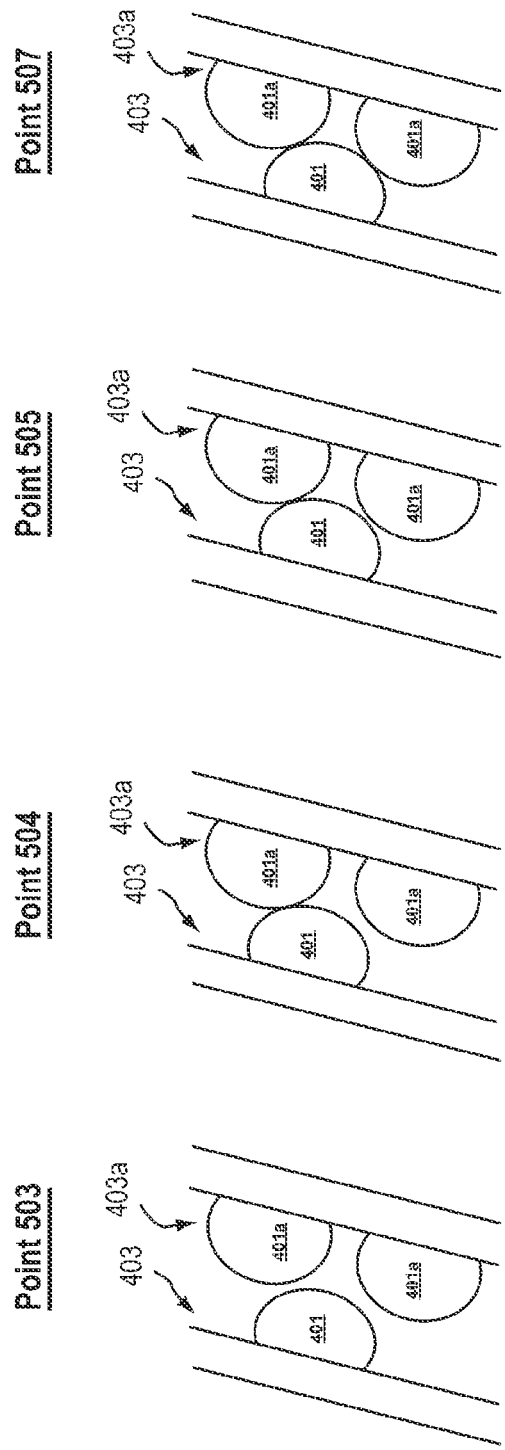
FIGS. 13A, 13B, 13C, and 13D schematically illustrates various positions of the stopping faces of the eighth exemplary embodiment at several different points along the movement path of the different pressure module as shown in FIG. 12.

FIG. 12 illustrates an exemplary path of the differential pressure module in the sixth, sevenths and eights exemplary embodiments, as the differential pressure module travels in a first and second substantially linear path and subsequently presses against the abutment portion. The path may be located or substantially located in a plane of movement. The plane of movement may be oriented parallel or substantially parallel to a direction of the primary particle beam path, wherein the direction of the primary beam path is measured at a location within the specimen chamber. However, it is also conceivable that the plane of movement is oriented obliquely relative to the direction of the primary particle beam path.

In what follows, the path of the differential pressure module is described with reference to FIG. 12 and relative to a right-handed coordinate system 510, as shown in FIG. 12, which corresponds to the right-handed coordinate system 510e of the sixth exemplary embodiment, which is shown in FIGS. 9 and 10 as well as to the right-handed coordinate system 510f of the seventh exemplary embodiment, which is shown in FIG. 14 and to the right-handed coordinate systems, which are shown in FIGS. 11A and 11B. Coordinate system 510 is oriented so that the z-axis is oriented parallel or substantially oriented parallel to the particle beam path. Furthermore, the x-axis is oriented in a plane, which is perpendicular or substantially oriented perpendicular to the particle beam path. The positive direction of the z coordinate axis is antiparallel or substantially antiparallel to the direction of the primary particle beam.

Point 500 is the initial position of the differential pressure module, which corresponds to the non-operating position of the differential pressure module. By way of example, at point 500, carriage 117e is at the end of the rail that is furthest away from the specimen chamber. As the carriage approaches the specimen chamber using the rail, the differential pressure module reaches point 501. At point 501, the direction of movement (defined by the velocity vector) has a negative z component and a positive x component. Similarly, as carriage 117e continues to approach the specimen chamber the differential pressure module reaches point 502, at which the direction of movement has a negative z component and a positive x component. Further, as the carriage continues to approach the specimen chamber the differential pressure module reaches point 503, at which the direction of movement has a negative z component and a positive x component. A magnified view of stopping face 403 and stopping face 403a for the eighth exemplary embodiment at point 503 is illustrated in FIG. 13A. The magnified views in each of FIGS. 13A to 13D represent a cross-sectional view taken along line D-D shown in FIGS. 11A and 11B. At point 503, the bearing elements of both stopping faces 403, 403a are still distant from each other. Accordingly, the cross-sectional view of FIG. 13A, shows no contact between the bearing element 401 of stopping face 403 and the bearing element 401a stopping face 403a.

Up to point 504, the direction of movement has a negative z component and a positive x component. The movement between points 500 and 504 represents a path, which is convex toward the objective lens 7g of the particle optical arrangement 2g. Thereby, the path deviates from a straight linear line 511 and is curved downwards. The path between points 500 and 504 is located within a plane of movement. The plane of movement is located parallel or substantially parallel to a direction of the particle beam path, wherein the direction is measured at a location within the specimen chamber. In the sixth and seventh exemplary embodiments, at point 504, the first abutment surface makes contact with the second abutment surface. It can be seen from FIG. 13B that in the eighth exemplary embodiment, at point 504, the bearing element 401 of stopping face 403 has come into contact with the bearing element 401a of stopping face 403a. From position 504 on, the bearing elements 401, 401a of the stopping faces 403, 403a act cooperatively to guide the movement of the stopping face 403 relative to the stopping face 403a so that the stopping face 403 reaches a well-defined position and orientation relative to stopping face 403a when the stopping face 403 is firmly pressed against stopping face 403a. The well-defined position and orientation therefore represents the final position and orientation of the stopping face 403 relative to stopping face 403a, which also defines the final position of the differential pressure module. Hence, the bearing elements of stopping faces 403 and 403a ensure that the differential pressure module can be accurately positioned relative to the primary particle beam path. The primary particle beam is therefore not affected by an inaccurate position of the differential pressure aperture of the differential pressure module.

The position of the differential pressure module at point 504 corresponds to the position of the differential pressure module 8e and 8f, respectively, as shown in FIGS. 10 and 14. At point 505, the direction of movement has a positive z component and a positive x component. At point 505, the bearing element of stopping face 403 is still in contact with the bearing element of stopping face 403a. A magnified view of stopping face 403 and stopping face 403a for the eighth exemplary embodiment at point 505 is illustrated in FIG. 13C. At point 506, the direction of movement has a positive z component and a positive x component. At point 507, the differential pressure module is in the operating position. In the eighth exemplary embodiment, at point 507, each of the protrusions of the bearing element 401 is supported by a corresponding pair of protrusions of the bearing element 401a. Hence, the bearing elements 401, 401a of both stopping faces 403, 403a are in abutment against each other so that the position and orientation of the stopping faces 403, 403a relative to each other is the well-defined final position and orientation. A magnified view of stopping face 403 and stopping face 403a for the eighth exemplary embodiment at point 507 is illustrated in FIG. 13D. For the sixth exemplary embodiment, the position of the differential pressure module at point 507 is illustrated in FIG. 9.

Although in the foregoing paragraphs, the path of the differential pressure module, as shown in FIG. 12 has been described predominantly with reference to the eighth exemplary embodiment, the disclosure of FIG. 12 refers to each of the sixth, seventh and eighth embodiment.

As can be seen from FIG. 12, the differential pressure module initially moves in a first substantially linear path. A starting point of the first substantially linear path is the non-operating position 500 of the differential pressure module. The differential pressure module moves in the first substantially linear path until there is contact between the first abutment surface and the second abutments surface. In the eighth exemplary embodiment, this corresponds to a contact between stopping face 403 and stopping face 403a as shown in FIG. 13B. In the path, which is illustrated in FIG. 12, this is at point 504. Then, after completion of the first substantially linear path at point 504, the differential pressure module moves in a second substantially linear path until the differential pressure module is in the operating position. In the operating position, the differential pressure module may be pressed against the abutment portion.

The second substantially linear path is approximately traverse, oblique, or substantially perpendicular or perpendicular to the first substantially linear path. The first substantially linear path may be the advancing movement of the differential pressure module. Additionally or alternatively, the second substantially linear path may be the pressing movement of the differential pressure module.

The starting point of the first substantially linear path and the end point of the first substantially linear path may be separated from each other by a distance of at least 50 millimeters, or at least 100 millimeters or at least 200 millimeters or at least 300 millimeters or at least 400 millimeters. The distance may be less than 2000 millimeters or less than 1000 millimeters.

Additionally or alternatively, the starting point of the second substantially linear path and the end point of the second substantially linear path may be separated from each other by a distance of at least 1 millimeter or at least 3 millimeters or at least 5 millimeters or at least 10 millimeters or at least 20 millimeters. The distance may be less than 200 millimeters or less than 100 millimeters.

The first substantially linear path and the second substantially linear path may be located in a common plane of movement. The plane of movement may be parallel or substantially parallel to a direction of the primary particle beam path, wherein the direction is measured at a location within the specimen chamber. At least a portion of the first substantially linear path may be convex toward the objective lens. At least a portion of the second substantially linear path may be concave toward the positioning arm.

In what follows, an example of the path, which is illustrated in FIG. 12, is given relative to the coordinate system 510. The differential pressure module starts at point 500 with an x coordinate value of 251.34 mm and a z coordinate value of 136.18 mm. As the differential pressure module moves to point 501 it has an x coordinate value of 351.36 mm and a z coordinate value of 135.87 mm. At point 502 the differential pressure module has an x coordinate value of 441.54 mm and a z coordinate value of 132.75 mm. At point 503, the differential pressure module has an x coordinate value of 446.73 mm and a z coordinate value of 132.51 mm. At point 504, the differential pressure module has an x coordinate value of 447.75 mm and a z coordinate value of 132.16 mm. At point 505, the differential pressure module has an x coordinate value of 448.01 mm and a z coordinate value of 132.86 mm. At point 506, the differential pressure module has an x coordinate value of 448.21 mm and a z coordinate value of 134.70 mm. At point 507, the differential pressure module has an x coordinate value of 448.32 mm and a z coordinate value of 136.20 mm.

While the invention is described and illustrated here in the context of a limited number of embodiments, the invention may be embodied in many forms without departing from the spirit of the essential characteristics of the invention. The illustrated and described embodiments, including what is described in the abstract of the disclosure, are therefore to be considered in all respects as illustrative and not restrictive. The scope of the invention is indicated by the appended claims rather than by the foregoing description, and all changes which come with the meaning and range of equivalency of the claims are intended to be embraced therein.

The invention claimed is:

1. A charged particle optical apparatus, comprising:
   a particle optical arrangement, configured to define a primary particle beam path for inspecting an object;
   a specimen chamber configured to accommodate an object in a pressure-controlled interior of the specimen chamber during the inspection of the object;
   a differential pressure module having a differential pressure aperture; and
   a positioning arm being at least partially arranged in the specimen chamber and configured to selectively position the differential pressure module within the pressure-controlled interior of the specimen chamber into an operating position in which the primary particle beam path passes through the differential pressure aperture;
   a guide having a rail, wherein the selective positioning comprises an advancing movement of the differential pressure module directed toward the primary particle beam path, wherein the advancing movement is a substantially longitudinal track-guided movement of the positioning arm along the guide.

2. The charged particle optical apparatus of claim 1, wherein the advancing movement of the differential pressure module and/or the track-guided movement of the positioning arm is a substantially translational movement.

3. The charged particle optical apparatus of claim 1, wherein the rail extends transverse or substantially perpendicular to a direction of the particle beam path, wherein the direction of the particle beam path is measured at a location within the specimen chamber.

4. The charged particle optical apparatus of claim 1,
wherein at least a portion of the guide is located in the surrounding atmosphere of the charged particle optical apparatus;
wherein the at least the portion of the guide, which is located in the surrounding atmosphere comprises two mating guide members.

5. The charged particle optical apparatus of claim 1, wherein the differential pressure module comprises a module-mounted detector for detecting particles and/or radiation;
wherein the differential pressure aperture is formed by a component of the module-mounted particle detector, which contributes to a generation of a detector signal in response to receiving particles and/or radiation.

6. The charged particle optical apparatus of claim 1, wherein during the advancing movement of the differential pressure module, at least a portion of the positioning arm passes through at least a portion of an opening, which extends through a wall portion of the specimen chamber.

7. The charged particle optical apparatus of claim 1, wherein during the advancing movement of the differential pressure module, at least portion of a driving member of the particle optical apparatus, which is drivingly coupled to the positioning arm, passes through at least the portion of an opening, which extends through a wall portion of the specimen chamber.

8. The charged particle optical apparatus of claim 1, wherein the differential pressure module comprises an intermediate vacuum zone, wherein in the operating position of the differential pressure module, the particle beam path passes through the intermediate vacuum zone.

9. The charged particle optical apparatus of claim 8, wherein the intermediate vacuum zone comprises a vacuum port for evacuating the intermediate vacuum zone.

10. The charged particle optical apparatus of claim 1, wherein the differential pressure module comprises two intermediate vacuum zones.

11. The charged particle optical apparatus of claim 1, wherein a degree of freedom of the positioning arm for performing at least a portion of the positioning of the differential pressure module is provided by a guide clearance of the guide.

12. The charged particle optical apparatus of claim 1,
wherein the guide comprises two mating guide members;
wherein the positioning arm is connected by a movable connection to the guide so that an orientation of the positioning arm relative to each of the guide members is variable.

13. The charged particle optical apparatus of claim 12, wherein a degree of freedom of the positioning arm for performing at least a portion of the positioning of the differential pressure module is provided by the movable connection.

14. The charged particle optical apparatus of claim 1, wherein the positioning arm is an elongate body extending along a longitudinal axis of the positioning arm;
wherein the longitudinal axis of the positioning arm is oriented at an angle relative to a plane which is perpendicular to a direction of the primary beam path, wherein the angle is smaller than 80 degrees and the direction is measured at a location within the specimen chamber;
wherein the positioning arm is configured as a guide member of the guide.

15. The charged particle optical apparatus of claim 1, wherein the positioning arm is an elongate body extending along a longitudinal axis of the positioning arm;
wherein the longitudinal axis is oriented transverse or substantially perpendicular to a direction of the primary beam path; wherein the direction is measured at a location within the specimen chamber;
wherein the positioning arm is configured as a guide member of the guide.

16. The charged particle optical apparatus of claim 1,
wherein the rail is oriented at an angle relative to a plane which is perpendicular to a direction of the primary beam path, wherein the direction is measured at a location within the specimen chamber;
wherein the angle is smaller than 80 degrees.

17. The charged particle optical apparatus of claim 1, further comprising a first and a second bearing element which cooperatively form a positioning bearing;
wherein:
during the positioning of the differential pressure aperture into the operating position, the first bearing element is brought into contact with the second bearing element, and
the positioning bearing is configured to bring the positioning arm into a final position in which the differential pressure module is in the operating position.

18. The charged particle optical apparatus of claim 17, wherein
the first bearing element is rigidly coupled to the positioning arm and/or to one of two mating guide members of a guide for guiding the track-guided movement; and
the second bearing element is rigidly coupled to the objective lens and/or the specimen chamber.

19. The charged particle optical apparatus of claim 4, wherein during the advancing movement of the differential pressure module,
at least a portion of the positioning arm passes through at least a portion of an opening, which extends through a wall portion of the specimen chamber; and/or
at least portion of a driving member of the particle optical apparatus, which is drivingly coupled to the positioning arm, passes through at least the portion of the opening.

20. The charged particle optical apparatus of claim 4, wherein the two mating guide members comprise a first and a second guide member; wherein the first guide member forms the rail and the second guide member is configured to be movable along the rail.

21. The charged particle optical apparatus of claim 8, wherein the differential pressure module comprises a further differential pressure aperture through which the primary particle beam path enters into the intermediate vacuum zone when the differential pressure module is in the operating position.

22. The charged particle optical apparatus of claim 21, wherein the intermediate vacuum zone further comprises a vacuum port for evacuating the intermediate vacuum zone.

23. The charged particle optical apparatus of claim 10, wherein each of the two intermediate vacuum zones comprises a vacuum port for evacuating the respective vacuum zone.

24. The charged particle optical apparatus of claim 23, wherein the charged particle optical apparatus comprises a branched vacuum line having two branch lines; wherein in the operating position, each of the two branch lines is connected in fluid communication with one of the two vacuum ports.

25. The charged particle optical apparatus of claim 5, wherein the component of the module-mounted detector is a portion of a semiconductor substrate of the module-mounted detector or a portion of a scintillator detector of the module-mounted detector.

26. The charged particle optical apparatus of claim 6, wherein the positioning arm is an elongate body extending along a longitudinal axis of the positioning arm;
wherein the longitudinal axis of the positioning arm is oriented at an angle relative to a plane which is perpendicular to a direction of the primary beam path, wherein the angle is smaller than 80 degrees and the direction is measured at a location within the specimen chamber.

27. The charged particle optical apparatus of claim 6, wherein the positioning arm is an elongate body extending along a longitudinal axis of the positioning arm;
wherein the longitudinal axis is oriented transverse or substantially perpendicular to a direction of the primary beam path; wherein the direction is measured at a location within the specimen chamber.

28. The charged particle optical apparatus of claim 11, further comprising a first and a second bearing element which cooperatively form a positioning bearing;
wherein:
during the positioning of the differential pressure aperture into the operating position, the first bearing element is brought into contact with the second bearing element, and
the positioning bearing is configured to bring the positioning arm into a final position in which the differential pressure module is in the operating position.

29. The charged particle optical apparatus of claim 28, wherein
the first bearing element is rigidly coupled to one of two mating guide members of the guide; and
the second bearing element is rigidly coupled to the objective lens and/or the specimen chamber.

30. The charged particle optical apparatus of claim 11, wherein
during the advancing movement of the differential pressure module, at least a portion of the positioning arm passes through at least a portion of an opening, which extends through a wall portion of the specimen chamber;
the advancing movement of the differential pressure module represents a first path of the differential pressure module; and
wherein the guide clearance causes at least a portion of the first path to be convex toward the objective lens.

31. The charged particle optical apparatus of claim 30, wherein the rail extends transverse or substantially perpendicular to a direction of the particle beam path, wherein the direction of the particle beam path is measured at a location within the specimen chamber.

32. The charged particle optical apparatus of claim 11, wherein the degree of freedom is configured for pressing the differential pressure module against an abutment portion of the objective lens;
wherein in the operating position, the differential pressure module is abutted against the abutment portion.

33. The charged particle optical apparatus of claim 1, wherein the positioning arm is an elongate body extending along a longitudinal axis of the positioning arm;
wherein the track-guided movement of the positioning arm is directed toward a segment of the particle beam path, which extends inside the specimen chamber;
wherein the positioning arm is configured as a guide member of the guide.

34. The charged particle optical apparatus of claim 1, wherein the positioning arm is an elongate body extending along a longitudinal axis of the positioning arm;
wherein an angle between the longitudinal axis of the positioning arm and a direction of the track-guided movement of the positioning arm is less than 40 degrees;
wherein the track-guided movement of the positioning arm is directed toward a segment of the particle beam path, which extends inside the specimen chamber.

35. The charged particle optical apparatus of claim 1, wherein the positioning arm is an elongate body extending along a longitudinal axis of the positioning arm;
wherein an angle between the longitudinal axis of the positioning arm and a direction of the track-guided movement of the positioning arm is less than 40 degrees;
wherein the longitudinal axis of the positioning arm is oriented transverse or substantially
perpendicular to a direction of the particle beam path, which is measured at a location within the specimen chamber.

36. The charged particle optical apparatus of claim 1, wherein the positioning arm is an elongate body extending along a longitudinal axis of the positioning arm;
wherein an angle between the longitudinal axis of the positioning arm and a direction of the track-guided movement of the positioning arm is less than 40 degrees;
wherein the longitudinal axis of the positioning arm is oriented at an angle relative to a plane which is perpendicular to a direction of the primary beam path, wherein the angle is smaller than 80 degrees and the direction is measured at a location within the specimen chamber.

37. The charged particle optical apparatus of claim 1, wherein the rail is located outside of the specimen chamber and in the surrounding atmosphere.

38. The charged particle optical apparatus of claim 1, wherein the rail is located outside of the specimen chamber or in the surrounding atmosphere.

* * * * *